United States Patent
Miyake et al.

(10) Patent No.: US 9,614,022 B2
(45) Date of Patent: Apr. 4, 2017

(54) DISPLAY DEVICE AND ELECTRONIC DEVICE COMPRISED OF MULTIPLE DISPLAY PANELS

(71) Applicant: Semiconductor Energy Laboratory Co., Ltd., Atsugi-shi, Kanagawa-ken (JP)

(72) Inventors: Hiroyuki Miyake, Kanagawa (JP); Hisao Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/616,995

(22) Filed: Feb. 9, 2015

(65) Prior Publication Data
US 2015/0228704 A1 Aug. 13, 2015

(30) Foreign Application Priority Data

Feb. 11, 2014 (JP) .................. 2014-023930
Mar. 7, 2014 (JP) .................. 2014-045128

(51) Int. Cl.
*H01L 27/32* (2006.01)
*H01L 51/00* (2006.01)
*H01L 51/52* (2006.01)

(52) U.S. Cl.
CPC ...... *H01L 27/3293* (2013.01); *H01L 51/0097* (2013.01); *H01L 51/5212* (2013.01);
(Continued)

(58) Field of Classification Search
CPC ............ H01L 27/3293; H01L 51/5212; H01L 51/5228; H01L 51/0097; H01L 2251/5338; H01L 27/3297; Y02E 10/549
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001713035 A 12/2005
CN 101996535 A 3/2011
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — John P Dulka
*Assistant Examiner* — Charles R Peters
(74) *Attorney, Agent, or Firm* — Fish & Richardson P.C.

(57) ABSTRACT

To provide a display device that is suitable for increasing in size, a display device in which display unevenness is suppressed, or a display device that can display an image along a curved surface. The display device includes a first display panel and a second display panel each including a pair of substrates. The first display panel and the second display panel each include a first region which can transmit visible light, a second region which can block visible light, and a third region which can perform display. The third region of the first display panel and the first region of the second display panel overlap each other. The third region of the first display panel and the second region of the second display panel do not overlap each other.

23 Claims, 21 Drawing Sheets

(52) U.S. Cl.
CPC ...... *H01L 51/5228* (2013.01); *H01L 27/3297* (2013.01); *H01L 2251/5338* (2013.01); *Y02E 10/549* (2013.01)

(56) References Cited

U.S. PATENT DOCUMENTS

| | | |
|---|---|---|
| 5,801,797 A | 9/1998 | Iida et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0113546 A1 | 8/2002 | Seo et al. |
| 2002/0132454 A1 | 9/2002 | Ohtsu et al. |
| 2003/0032210 A1 | 2/2003 | Takayama et al. |
| 2003/0090198 A1* | 5/2003 | Aston ................ G02F 1/13336 313/498 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0285811 A1 | 12/2005 | Kawase et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197769 A1 | 8/2008 | Seo et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239320 A1 | 9/2009 | Takayama et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0164906 A1* | 7/2010 | Fukunaga ............... G06F 3/042 345/175 |
| 2010/0177018 A1 | 7/2010 | Wang et al. |
| 2011/0050657 A1* | 3/2011 | Yamada ............... H01L 27/3293 345/204 |
| 2011/0057861 A1 | 3/2011 | Cok et al. |
| 2012/0268445 A1 | 10/2012 | Ogata et al. |
| 2013/0200783 A1 | 8/2013 | Van Heck et al. |
| 2013/0201636 A1 | 8/2013 | Van Den Brand et al. |
| 2013/0201637 A1 | 8/2013 | De Kok et al. |
| 2013/0214324 A1 | 8/2013 | Takayama et al. |
| 2015/0028316 A1* | 1/2015 | Kojima ............... H01L 51/5212 257/40 |
| 2016/0014882 A1* | 1/2016 | Jongman ............. H01L 27/3293 361/749 |

FOREIGN PATENT DOCUMENTS

| | | |
|---|---|---|
| CN | 102742027 A | 10/2012 |
| CN | 102742369 A | 10/2012 |
| CN | 102742371 A | 10/2012 |
| DE | 102010000020 | 8/2010 |
| EP | 1612658 A | 1/2006 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-311344 A | 12/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-324673 A | 11/2002 |
| JP | 2003-086000 A | 3/2003 |
| JP | 2003-086808 A | 3/2003 |
| JP | 2003-174153 A | 6/2003 |
| JP | 2004-103957 A | 4/2004 |

(56) References Cited

FOREIGN PATENT DOCUMENTS

| | | | | |
|---|---|---|---|---|
| JP | 2004-273614 A | 9/2004 | | |
| JP | 2004-273732 A | 9/2004 | | |
| JP | 2006-010811 A | 1/2006 | | |
| JP | 2010-160489 A | 7/2010 | | |
| JP | 2010-266777 A | 11/2010 | | |
| JP | 2011-022302 A | 2/2011 | | |
| JP | 2011-047976 A | 3/2011 | | |
| JP | 2011-047977 A | 3/2011 | | |
| JP | 2011-192567 A | 9/2011 | | |
| JP | 2012-028638 | * | 2/2012 | ............ H01L 51/50 |
| JP | 2012-028638 A | 2/2012 | | |
| JP | WO 2013/128740 | * | 12/2012 | ............ H01L 51/56 |
| JP | 2013-518308 | 5/2013 | | |
| JP | 2013-518388 | 5/2013 | | |
| JP | 2013-519106 | 5/2013 | | |
| KR | 2006-0048387 A | 5/2006 | | |
| TW | I257596 | 7/2006 | | |
| TW | 201027162 | 7/2010 | | |
| WO | WO-2004/114391 | 12/2004 | | |
| WO | WO-2011/093711 | 8/2011 | | |
| WO | WO-2011/093712 | 8/2011 | | |
| WO | WO-2011/093713 | 8/2011 | | |
| WO | WO-2013/128740 | 9/2013 | | |

OTHER PUBLICATIONS

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—Bo System [A; Fe, Ga, Or Al; B: Mg, Fe, Ni, Cu,Or Zn] at temperatures over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transaction on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display with Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Nowatari.H et al., "60.2: Intermediate Connector with Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bening Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/IB2015/050766) Dated Apr. 21, 2015.

Written Opinion (Application No. PCT/IB2015/050766) Dated Apr. 21, 2015.

\* cited by examiner

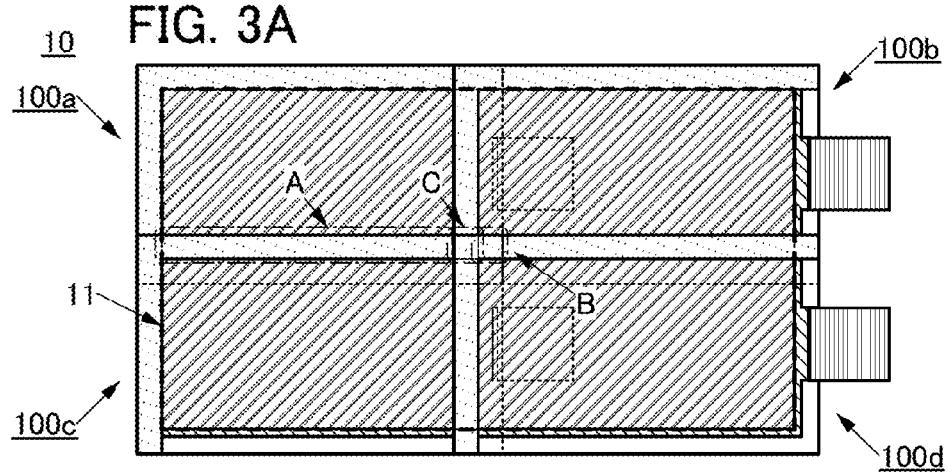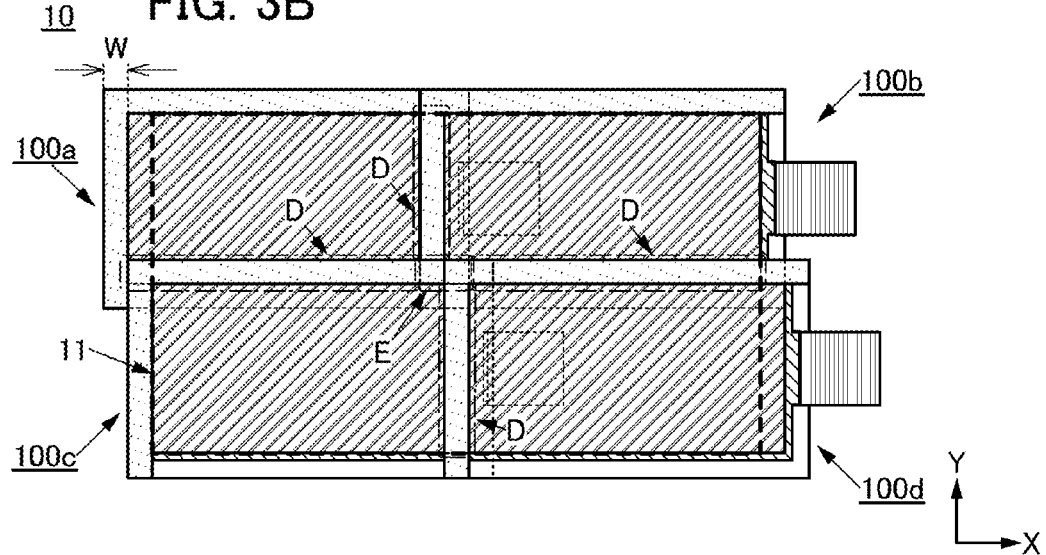

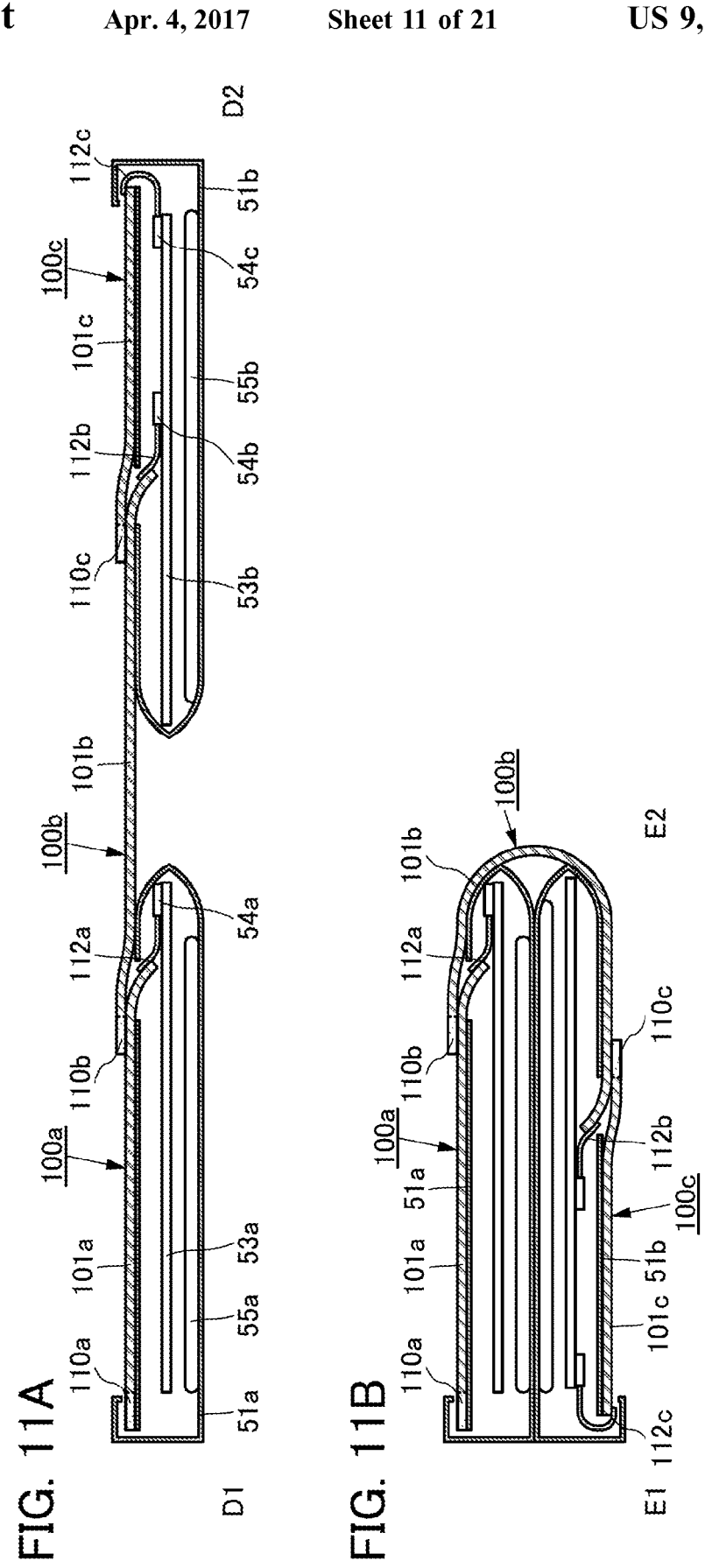

FIG. 19A
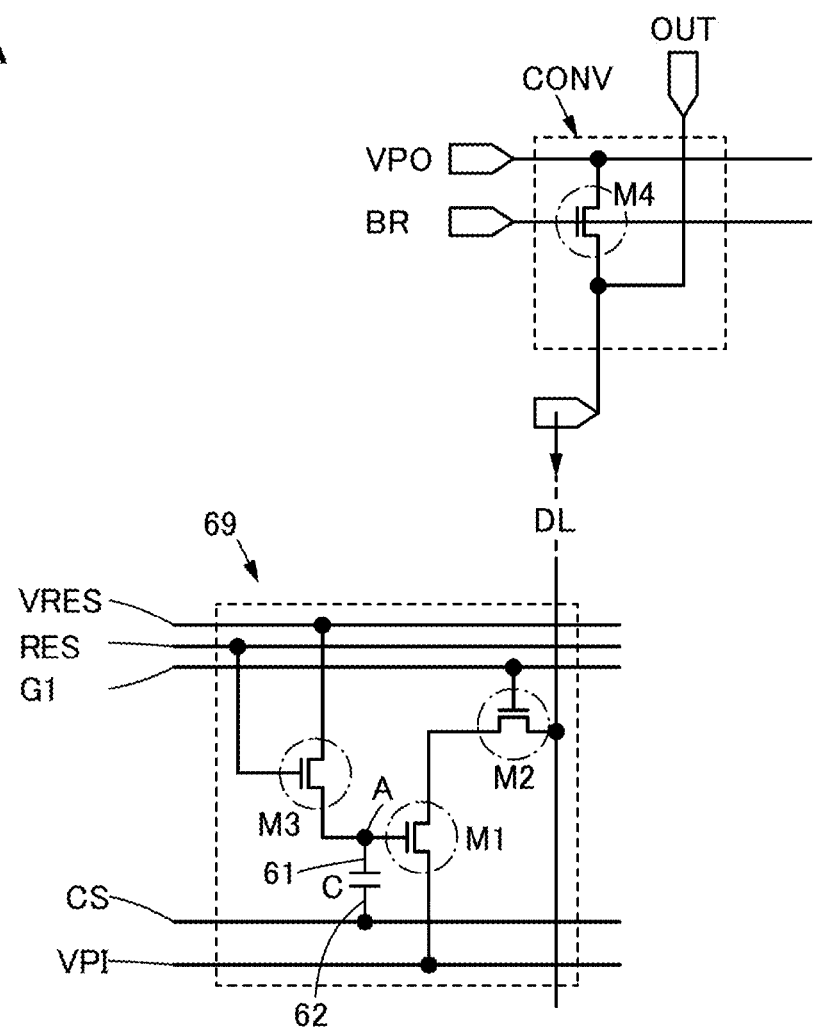
FIG. 19B1
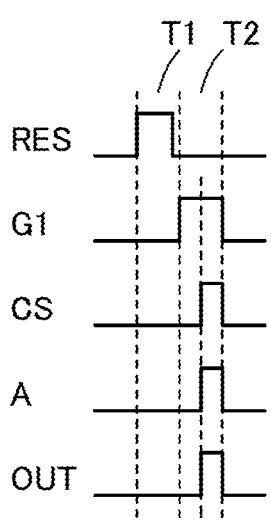
FIG. 19B2
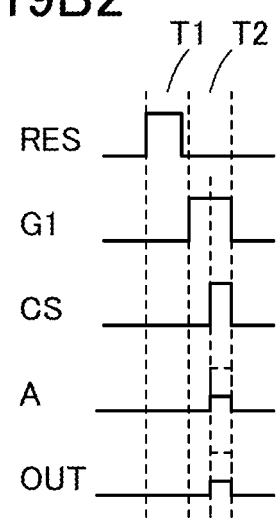

DISPLAY DEVICE AND ELECTRONIC DEVICE COMPRISED OF MULTIPLE DISPLAY PANELS

TECHNICAL FIELD

One embodiment of the present invention relates to a display device. Furthermore, one embodiment of the present invention relates to an electronic device including a display device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a storage device, a method for driving any of them, and a method for manufacturing any of them.

BACKGROUND ART

In recent years, larger display devices have been required. For example, a television device for home use (also referred to as a TV or a television receiver), digital signage, and a public information display (PID) are given. Larger digital signage, PID, and the like can provide the increased amount of information, and attract more attention when used for advertisement or the like, so that the effectiveness of the advertisement is expected to be increased.

In addition, for application to mobile devices, larger display devices have been required. In recent years, browsability of display has been improved by increasing the amount of information to be displayed with an increase of a display region of a display device.

Examples of the display device include, typically, a light-emitting device including a light-emitting element such as an organic electroluminescent (EL) element or a light-emitting diode (LED), a liquid crystal display device, and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element needs no backlight which is necessary for liquid crystal display devices and the like; therefore, thin, lightweight, high contrast, and low power consumption display devices can be obtained. For example, Patent Document 1 discloses an example of a display device including an organic EL element.

Furthermore, Patent Document 2 discloses a flexible active matrix light-emitting device in which an organic EL element and a transistor serving as a switching element are provided over a film substrate.

REFERENCE

Patent Document

[Patent Document 1] Japanese Published Patent Application No. 2002-324673

[Patent Document 2] Japanese Published Patent Application No. 2003-174153

DISCLOSURE OF INVENTION

An object of one embodiment of the present invention is to provide a display device that is suitable for increasing in size. Another object of one embodiment of the present invention is to provide a display device in which display unevenness is suppressed. Another object of one embodiment of the present invention is to provide a display device that can display an image along a curved surface.

Another object is to provide a highly browsable electronic device. Another object is to provide a highly portable electronic device.

Another object is to provide a novel display device. Another object is to provide a novel electronic device.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention is a display device including a first display panel and a second display panel. The first display panel and the second display panel each include a pair of substrates. The first display panel and the second display panel each include a first region, a second region, and a third region. The first region includes a region which can transmit visible light. The second region includes a region which can block visible light. The third region includes a region which can perform display. The display device includes a region in which the third region of the first display panel and the first region of the second display panel overlap each other. The display device includes a region in which the third region of the first display panel and the second region of the second display panel do not overlap each other.

In the above display device, it is preferable that the first display panel and the second display panel each include a light-emitting element in the third region, the first display panel and the second display panel each include a wiring provided along part of an outer edge of the third region in the second region, the first display panel and the second display panel each include a sealant provided along another part of the outer edge of the third region in the first region, and the first region include a region with a width of 1 mm or more and 100 mm or less.

Another embodiment of the present invention is a display device including a first display panel, a second display panel, and a third display panel. The first display panel, the second display panel, and the third display panel each include a pair of substrates. The first display panel, the second display panel, and the third display panel each include a first region, a second region, and a third region. The first region includes a region which can transmit visible light. The second region includes a region which can block visible light. The third region includes a region which can perform display. The first display panel, the second display panel, and the third display panel each include a light-emitting element in the third region. The first display panel, the second display panel, and the third display panel each include a wiring provided along part of an outer edge of the third region in the second region. The first display panel, the second display panel, and the third display panel each include a sealant provided along another part of the outer edge of the third region in the first region. The first region includes a region with a width of 1 mm or more and 100 mm or less. The display device includes a region in which the third region of the first display panel and the first region of the second display panel overlap each other. The display device includes a region in which the third region of the first display panel and the second region of the second display panel do not overlap each other. The display device includes a region in which the third region of the first display panel and the first region of the third display panel overlap each other. The display device includes a region in which the third region of the first display panel and the second region of the third display panel do not overlap each other. The display device includes a region in which the third region of the second display panel and the second region of the third display panel do not overlap each other.

The pair of substrates preferably each have flexibility.

It is preferable that the first display panel include an FPC, there be a region in which the FPC and the second region of the first display panel overlap each other, there be a region in which the FPC and the third region of the second display panel overlap each other, and the FPC be on a side opposite to a display surface side of the second display panel.

Furthermore, it is preferable that a layer be further included, the layer include a resin material, there be a region in which the layer and the third region of the first display panel overlap each other, there be a region in which the layer and the third region of the second display panel overlap each other, the layer include a portion which has a first refractive index, a substrate on a display surface side of the pair of substrates include a portion which has a second refractive index, and a difference between the first refractive index and the second refractive index be lower than or equal to 10%.

Another embodiment of the present invention is a display module including any one of the above display devices and a touch sensor.

Another embodiment of the present invention is a display module including any of the above display devices. The display module includes a first wireless module and a second wireless module. The first wireless module is capable of extracting a first signal from a received wireless signal and is capable of supplying the first signal to the first display panel. The second wireless module is capable of extracting a second signal from a received wireless signal and is capable of supplying the second signal to the second display panel.

Another embodiment of the present invention is a building including any of the above display devices or any of the above display modules. The building includes a column or a wall and the display device or the display module is on the column or the wall.

Another embodiment of the present invention is an electronic device including a first display panel, a second display panel, a third display panel, a first support, and a second support. The second display panel has flexibility. The first display panel, the second display panel, and the third display panel each include a first region, a second region, and a third region. The first region is capable of transmitting visible light. The second region is capable of blocking visible light. The third region is capable of performing display. There is a first portion in which the third region of the first display panel and the first region of the second display panel overlap each other. There is a second portion in which the third region of the second display panel and the first region of the third display panel overlap each other. The first display panel includes a region supported by the first support. The third display panel includes a region supported by the second support. The first support and the second support are capable of changing shapes between an opened state in which the first display panel, the second display panel, and the third display panel are on substantially the same plane, and a folded state in which the first display panel and the third display panel are positioned to overlap each other. In the folded state, the third region of the second display panel includes a foldable region and the first portion and the second portion each include a region which is not foldable.

In the above electronic device, it is preferable that the first display panel include a first FPC, there be a region in which the first FPC and the second region of the first display panel overlap each other, there be a region in which the first FPC and the third region of the second display panel overlap each other, and the first FPC be on a side opposite to a display surface side of the second display panel.

In the above electronic device, it is preferable that the second display panel include a second FPC, there be a region in which the second FPC and the second region of the second display panel overlap each other, there be a region in which the second FPC and the third region of the third display panel overlap each other, and the second FPC be on a side opposite to a display surface side of the third display panel.

In the above electronic device, it is preferable that the first display panel, the second display panel, and the third display panel each include a touch sensor. At this time, the touch sensor preferably includes a transistor and a capacitor. Furthermore, at this time, the transistor preferably includes an oxide semiconductor in a semiconductor in which a channel is formed.

One embodiment of the present invention can provide a display device that is suitable for increasing in size. One embodiment of the present invention can provide a display device in which display unevenness is suppressed. One embodiment of the present invention can provide a display device that can display an image along a curved surface. Alternatively, a highly browsable electronic device can be provided. Alternatively, a highly portable electronic device can be provided.

Alternatively, a novel display device (display panel) or a novel electronic device can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF DRAWINGS

In the accompanying drawings:

FIGS. 3A and 3B each illustrate a display device according to one embodiment;

FIGS. 11A and 11B illustrate a structure example of an electronic device including a display device according to one embodiment;

FIGS. 19A, 19B1, and 19B2 illustrate configurations and driving methods of a sensor circuit and a converter according to one embodiment;

BEST MODE FOR CARRYING OUT THE INVENTION

Figure 1A:
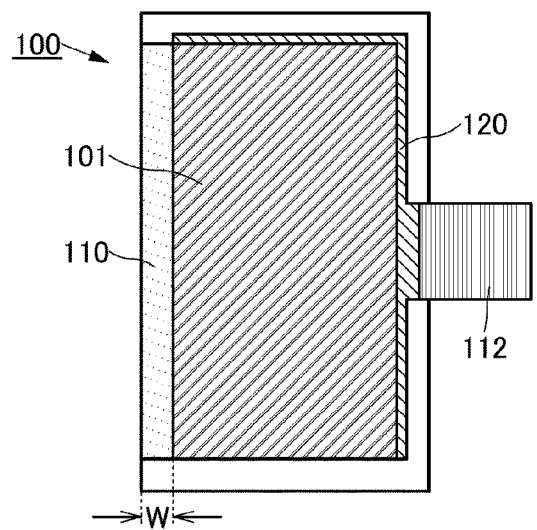
FIGS. 1A and 1B illustrate a display device according to one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In this embodiment, structure examples and application examples of a display device of one embodiment of the present invention are described with reference to drawings.

Structure Example 1

FIG. 1A is a schematic top view of a display panel 100 included in a display device of one embodiment of the present invention.

The display panel 100 includes a display region 101, and a region 110 transmitting visible light and a region 120 blocking visible light that are adjacent to the display region 101. Furthermore, the display panel 100 is provided with a flexible printed circuit (FPC) 112 in the example illustrated in FIG. 1A.

The display region 101 includes a plurality of pixels arranged in matrix and can display an image. One or more display elements are provided in each pixel. As the display element, typically, a light-emitting element such as an organic EL element, a liquid crystal element, or the like can be used.

In the region 110, for example, a pair of substrates included in the display panel 100, a sealant for sealing the display element sandwiched between the pair of substrates, and the like may be provided. Here, for members provided in the region 110, materials that transmit visible light are used.

In the region 120, for example, a wiring electrically connected to the pixels included in the display region 101 is provided. In addition to the wiring, driver circuits (such as a scan line driver circuit and a signal line driver circuit) for driving the pixels may be provided. Furthermore, in the region 120, a terminal electrically connected to the FPC 112 (also referred to as a connection terminal), a wiring electrically connected to the terminal, and the like may be provided.

Figure 1B:
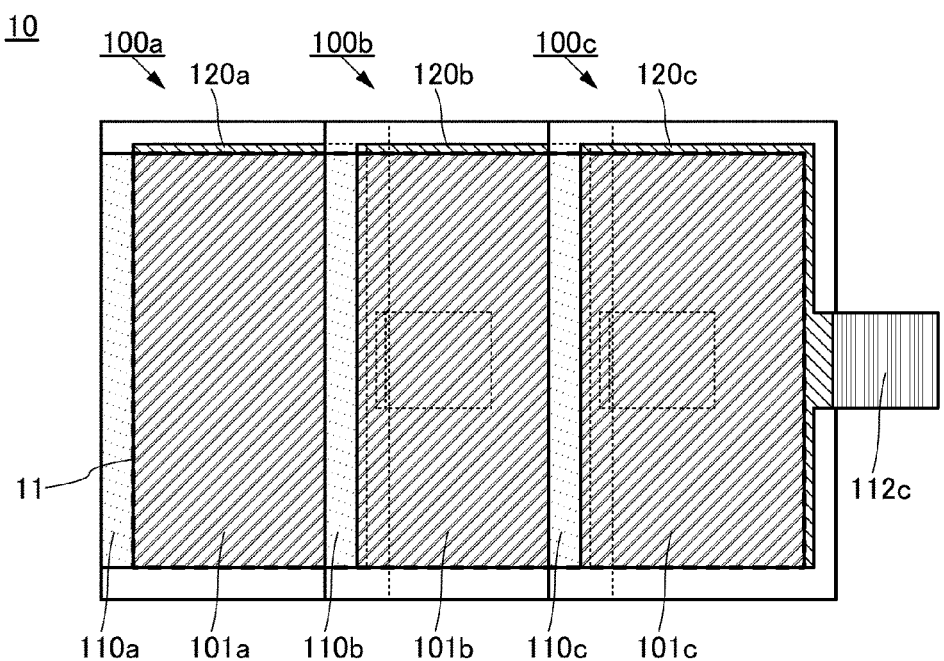

A display device 10 of one embodiment of the present invention includes a plurality of such display panels 100. FIG. 1B is a schematic top view of the display device 10 including three display panels.

Hereinafter, to distinguish the display panels from each other, the same components included in the display panels from each other, or the same components relating to the display panels from each other, letters are added to reference numerals. Unless otherwise specified, "a" is added to reference numerals for a display panel and components placed on the lowest side (the side opposite to the display surface side), and to one or more display panels and components placed thereover, "b" or letters after "b" in alphabetical order are added from the lower side. Furthermore, unless otherwise specified, in describing a structure in which a plurality of display panels is included, letters are not added when a common part of the display panels or the components is described.

The display device 10 in FIG. 1B includes a display panel 100a, a display panel 100b, and a display panel 100c.

The display panel 100b is placed so that part of the display panel 100b overlaps an upper side (a display surface side) of the display panel 100a. Specifically, the display panel 100b is placed so that a region 110b transmitting visible light of the display panel 100b overlaps part of a display region 101a of the display panel 100a, and the display region 101a of the display panel 100a and a region 120b blocking visible light of the display panel 100b do not overlap each other.

Furthermore, the display panel 100c is placed so that part of the display panel 100c overlaps an upper side (a display surface side) of the display panel 100b. Specifically, the display panel 100c is placed so that a region 110c transmitting visible light of the display panel 100c overlaps part of a display region 101b of the display panel 100b, and the display region 101b of the display panel 100b and a region 120c blocking visible light of the display panel 100c do not overlap each other.

The region 110b transmitting visible light overlaps the display region 101a; thus, the whole display region 101a can be visually recognized from the display surface side. Similarly, the whole display region 101b can also be visually recognized from the display surface side when the region 110c overlaps the display region 101b. Therefore, a region where the display region 101a, the display region 101b, and the display region 101c are placed seamlessly (a region surrounded by a bold dashed line in FIG. 1B) can serve as a display region 11 of the display device 10.

Here, the width W of the region 110 in FIG. 1A is greater than or equal to 0.5 mm and less than or equal to 150 mm, preferably greater than or equal to 1 mm and less than or equal to 100 mm, and further preferably greater than or equal to 2 mm and less than or equal to 50 mm. The region 110 serves as a sealing region, and as the width W of the region 110 is larger, the distance between an end surface of the display panel 100 and the display region 101 can become longer, so that entry of an impurity such as water into the display region 101 from the outside can be effectively suppressed. In particular, in this structure example, the region 110 is provided adjacent to the display region 101; thus, it is important to set the width W of the region 110 at an appropriate value. For example, in the case where an organic EL element is used as the display element, the width W of the region 110 is set to be greater than or equal to 1 mm, whereby deterioration of the organic EL element can be effectively suppressed. Note that also in a part other than the region 110, the distance between the end portion of the display region 101 and the end surface of the display panel 100 is preferably in the above range.

Structure Example 2

In FIG. 1B, the plurality of display panels 100 overlap each other in one direction; however, a plurality of display panels 100 may overlap each other in two directions of the vertical and horizontal directions.

Figure 2A:
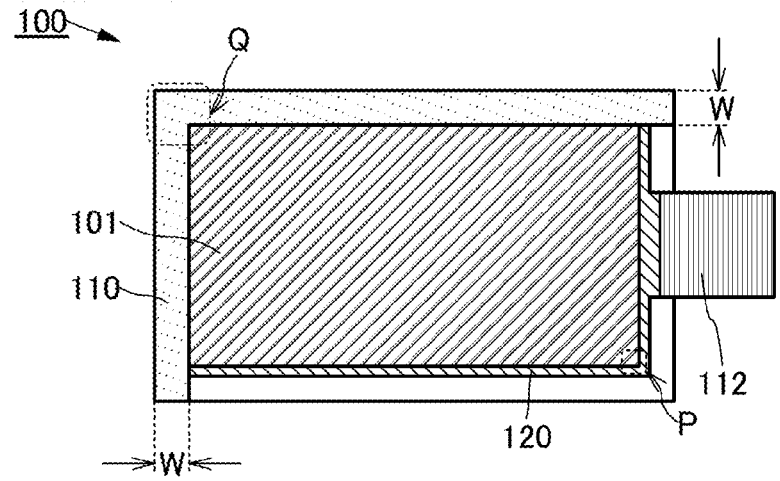
FIGS. 2A to 2C illustrate a display device according to one embodiment.

FIG. 2A shows an example of the display panel 100 in which the shape of the region 110 is different from that in FIG. 1A. In the display panel 100 in FIG. 2A, the region 110 is placed along adjacent two sides of the display region 101.

Figure 2B:
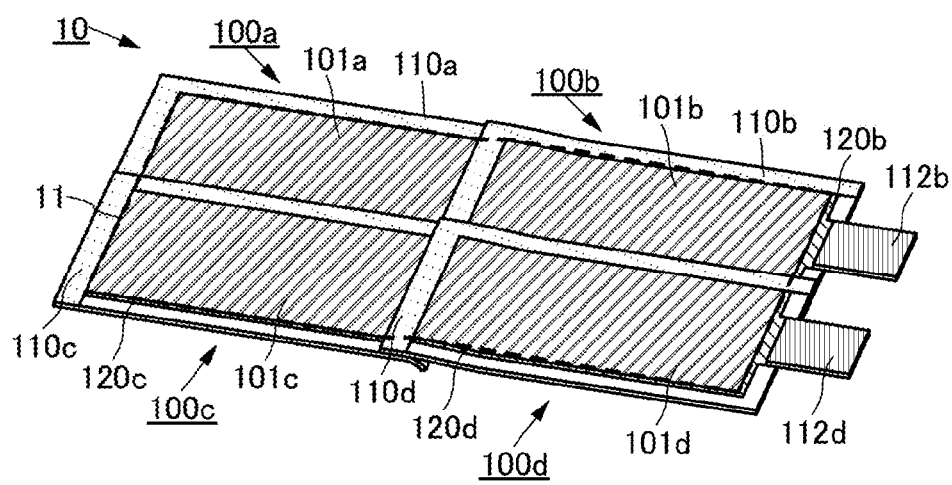
Figure 2C:
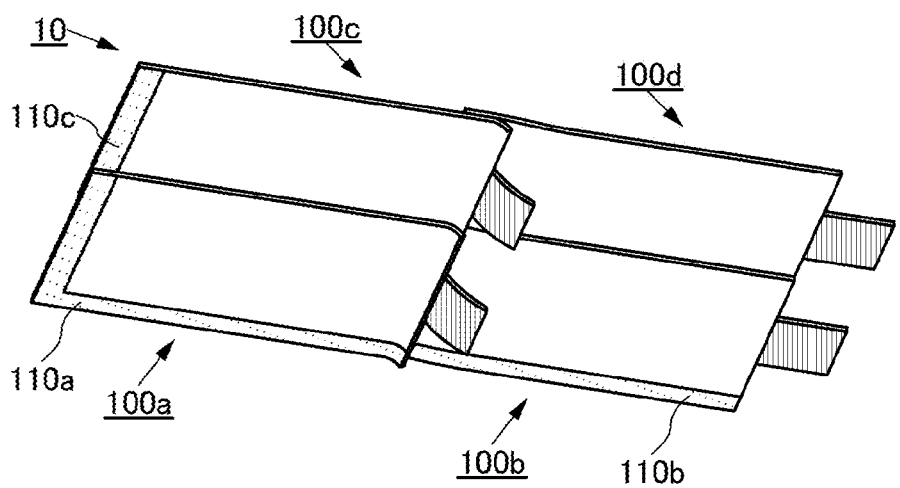

FIG. 2B is a schematic perspective view of the display device 10 in which the display panels 100 in FIG. 2A are arranged two by two in both vertical and horizontal directions. FIG. 2C is a schematic perspective view of the display device 10 when seen from a side opposite to the display surface side.

In FIGS. 2B and 2C, part of the region 110b of the display panel 100b overlaps a region along a short side of the display region 101a of the display panel 100a. In addition, part of the region 110c of the display panel 100c overlaps a region along a long side of the display region 101a of the display panel 100a. Moreover, the region 110d of the display panel 100d overlaps both a region along a long side of the display region 101b of the display panel 100b and a region along a short side of the display region 101c of the display panel 100c.

Therefore, as illustrated in FIG. 2B, a region where the display region 101a, the display region 101b, the display region 101c, and the display region 101d are placed seamlessly can serve as the display region 11 of the display device 10.

Here, it is preferable that a flexible material be used for the pair of substrates included in the display panel 100 and the display panel 100 have flexibility. Thus, as is the case of the display panel 100a in FIGS. 2B and 2C, part of the display panel 100a on the FPC 112a side is curved when the FPC 112a and the like are provided on the display surface side, whereby the FPC 112a can be placed under the display region 101b of the adjacent display panel 100b so as to overlap with the display region 101b, for example. As a result, the FPC 112a can be placed without physical interference with the rear surface of the display panel 100b. Furthermore, when the display panel 100a and the display panel 100b overlap and are bonded to each other, it is not necessary to consider the thickness of the FPC 112a; thus, the difference in height between the top surface of the region 110b of the display panel 100b and the top surface of the display region 101a of the display panel 100a can be reduced. As a result, the end portion over the display region 101a of the display panel 100b can be prevented from being visually recognized.

Moreover, each display panel 100 has flexibility, whereby the display panel 100b can be curved gently so that the top surface of the display region 101b of the display panel 100b and the top surface of the display region 101a of the display panel 100a are equal to each other in height. Thus, the heights of the display regions can be equal to each other except in the vicinity of the region where the display panel 100a and the display panel 100b overlap each other, so that the display quality of an image displayed on the display region 11 of the display device 10 can be improved.

Although, the relation between the display panel 100a and the display panel 100b is taken as an example in the above description, the same can apply to the relation between any two adjacent display panels.

Furthermore, to reduce the step between two adjacent display panels 100, the thickness of the display panel 100 is preferably small. For example, the thickness of the display panel 100 is preferably less than or equal to 1 mm, further preferably less than or equal to 300 µm, still further preferably less than or equal to 100 µm.

FIG. 3A is a schematic top view of the display device 10 in FIGS. 2B and 2C when seen from the display surface side.

Here, when the region 110 of one display panel 100 does not have sufficiently high transmittance with respect to visible light (e.g., light with a wavelength of greater than or equal to 400 nm and less than or equal to 700 nm), luminance of a displayed image may be decreased depending on the number of display panels 100 overlapping the display regions 101. For example, in a region A in FIG. 3A, one display panel 100c overlaps the display region 101a of the display panel 100a. In a region B, the two display panels 100 (the display panels 100c and 100d) overlap the display region 101b of the display panel 100b. In a region C, the three display panels 100 (the display panels 100b, 100c and 100d) overlap the display region 101a of the display panel 100a.

In this case, it is preferable that data of the displayed image be corrected so that the gray scale of the pixels is locally increased depending on the number of display panels 100 overlapping the display regions 101. In this manner, a decrease in the display quality of the image displayed on the display region 11 of the display device 10 can be suppressed.

Alternatively, the position of the display panel 100 placed in the upper portion may be shifted, whereby the number of display panels 100 overlapping the display regions 101 of the lower display panels 100 can be reduced.

In FIG. 3B, the display panel 100c and the display panel 100d placed on the display panel 100a and the display panel 100b are relatively shifted in one direction (X direction) by the distance of the width W of the region 110. At this time, there are two kinds of regions: a region D in which one display panel 100 overlaps a display region 101 of another display panel 100, and a region E in which two display panels 100 overlap a display region 101 of another display panel 100.

Note that the display panel 100 may be relatively shifted in a direction perpendicular to the X direction (Y direction).

In the case where the display panel 100 placed in the upper portion is relatively shifted, the shape of the contour of a region in which the display regions 101 of the display panels 100 are combined is different from a rectangular shape. Thus, in the case where the shape of the display region 11 of the display device 10 is set to a rectangular shape as illustrated in FIG. 3B, the display device 10 may be driven so that no image is displayed on the display regions 101 of the display panels 100 that are placed outside the display region 11. Here, considering the number of pixels in a region where an image is not displayed, more pixels than the number obtained by dividing the number of all the pixels in the rectangular display region 11 by the number of display panels 100 may be provided in the display region 101 of the display panel 100.

Although the distance of relative shift of each display panel 100 is set to an integral multiple of the width W of the region 110 in the above example, the distance is not limited thereto, and may be set as appropriate in consideration of the shape of the display panel 100, the shape of the display region 11 of the display device 10, in which the display panels 100 are combined, and the like.

In the display device 10 of one embodiment of the present invention, the unlimited number of display panels 100 can be connected to enlarge the size of the display region 11 unlimitedly. For example, in the case of using the display device 10 for home use, the diagonal size of the display region 11 may be greater than or equal to 20 inches and less than or equal to 100 inches, preferably greater than or equal to 40 inches and less than or equal to 90 inches. Alternatively, in the case of using the display device 10 in a portable electronic device such as a tablet terminal, the diagonal size of the display region 11 may be greater than or equal to 5 inches and less than or equal to 30 inches, preferably greater than or equal to 10 inches and less than or equal to 20 inches. Alternatively, in the case of using the display device 10 in a large commercial signboard or the like, the diagonal size of the display region 11 can be greater than or equal to 80 inches, greater than or equal to 100 inches, or greater than or equal to 200 inches.

Moreover, in the display device 10 of one embodiment of the present invention, the resolution (the number of pixels) of the display region 11 can be increased unlimitedly. For example, the resolution of the display region 11 is preferably adjusted to the normalized resolution, such as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a display device with high resolution, such as 4K, preferably 8K, or with higher resolution than 8K is preferably used. In personal use such as portable use and home use, as the resolution is increased, the definition is increased, so that a realistic sensation, sense of depth, and the like can be increased. Furthermore, in the case of using the display device in the commercial signboard or the like, as the resolution is increased, the amount of information that can be displayed can be increased.

[Cross-Sectional Structure Example]

Figure 4A:
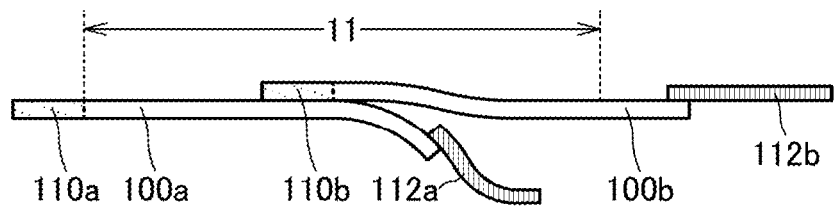
FIGS. 4A to 4D each illustrate a display device according to one embodiment.

FIG. 4A is a schematic cross-sectional view when the two display panels 100 are bonded to each other. In FIG. 4A, the FPC 112a and an FPC 112b are connected to the display panel 100a and the display panel 100b on the display surface side, respectively.

Figure 4B:
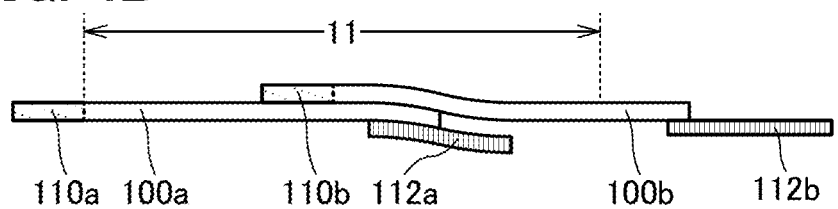

Alternatively, as illustrated in FIG. 4B, the FPC 112a and the FPC 112b may be connected to the display panel 100a and the display panel 100b on a side opposite to the display surface side, respectively. With this structure, the end portion of the display panel 100a positioned on the lower side can be attached to the rear surface of the display panel 100b; thus, the attachment area can be increased and the mechanical strength of the attached portion can be increased.

Figure 4C:
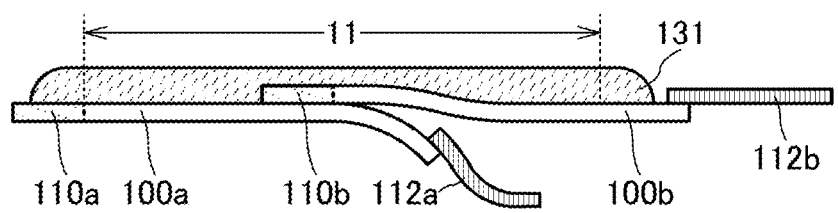
Figure 4D:
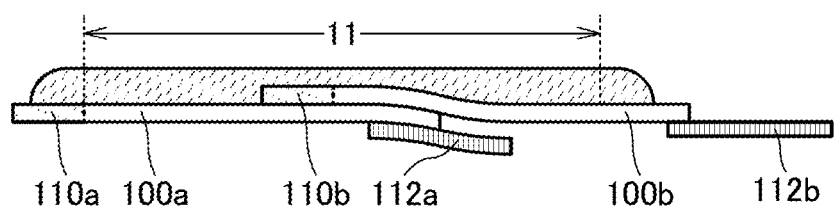

Alternatively, as illustrated in FIGS. 4C and 4D, a light-transmitting resin layer 131 may be provided to cover the top surfaces of the display panel 100a and the display panel 100b. Specifically, the resin layer 131 is preferably provided to cover the display regions of the display panels 100a and 100b and a region where the display panel 100a and the display panel 100b overlap.

By providing the resin layer 131 over the plurality of display panels 100, the mechanical strength of the display device 10 can be increased. In addition, the resin layer 131 is formed to have a flat surface, whereby the display quality of an image displayed on the display region 11 can be increased. For example, when a coating apparatus such as a slit coater, a curtain coater, a gravure coater, a roll coater, or a spin coater is used, the resin layer 131 with high flatness can be formed.

Furthermore, a difference in refractive index between the resin layer 131 and the substrate on the display surface side of the display panel 100 is preferably less than or equal to 20%, further preferably less than or equal to 10%, still further preferably less than or equal to 5%. By using the resin layer 131 having such a refractive index, the refractive index difference between the display panel 100 and the resin can be reduced and light can be efficiently extracted outside. In addition, the resin layer 131 with such a refractive index is provided to cover a step portion between the display panel 100a and the display panel 100b, whereby the step portion is not easily recognized visually, and the display quality of an image displayed on the display region 11 of the display device 10 can be increased.

As a material used for the resin layer 131, for example, an organic resin such as an epoxy resin, an aramid resin, an acrylic resin, a polyimide resin, a polyamide resin, or a polyamide-imide resin can be used.

Figure 5A:
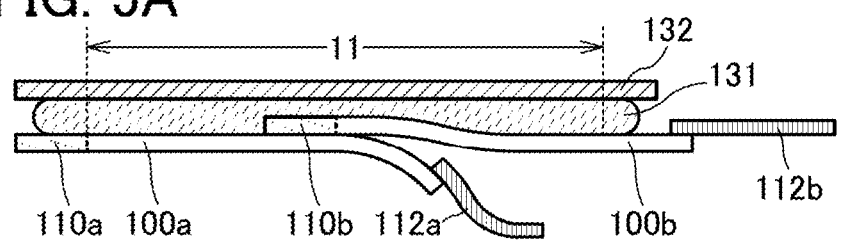
FIGS. 5A to 5D each illustrate a display device according to one embodiment.
Figure 5B:
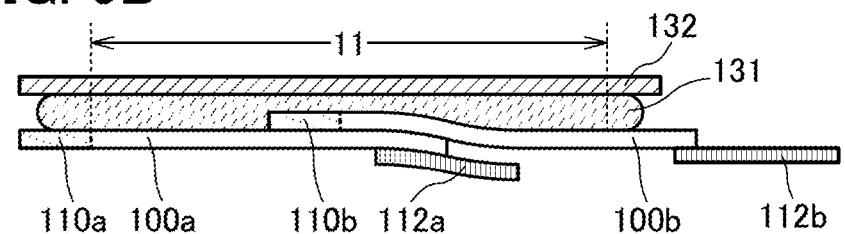

Alternatively, as illustrated in FIGS. 5A and 5B, a protective substrate 132 is preferably provided over the display device 10 with the resin layer 131 provided therebetween. Here, the resin layer 131 may serve as a bonding layer for bonding the protective substrate 132 to the display device 10. With the protective substrate 132, the surface of the display device 10 can be protected, and moreover, the mechanical strength of the display device 10 can be increased. For the protective substrate 132 in a region overlapping at least the display region 11, a light-transmitting material is used. Furthermore, the protective substrate 132 in a region other than the region overlapping the display region 11 may have a light-blocking property not to be visually recognized.

The protective substrate 132 may have a function of a touch panel. In the case where the display panel 100 is flexible and can be bent, the protective substrate 132 is also preferably flexible.

Furthermore, a difference in refractive index between the protective substrate 132 and the substrate on the display surface side of the display panel 100 or the resin layer 131 is preferably less than or equal to 20%, further preferably less than or equal to 10%, still further preferably less than or equal to 5%.

As the protective substrate 132, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, and the like, or a glass substrate can be used. The protective substrate 132 is preferably flexible. The protective substrate 132 includes a fiber or the like (e.g., a prepreg). Furthermore, the protective substrate 132 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

Figure 5C:
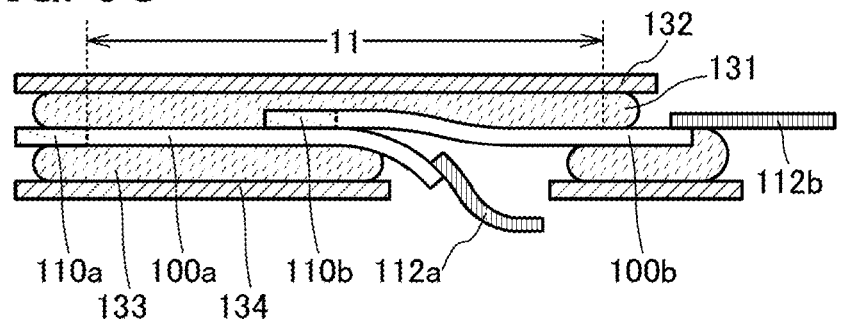
Figure 5D:
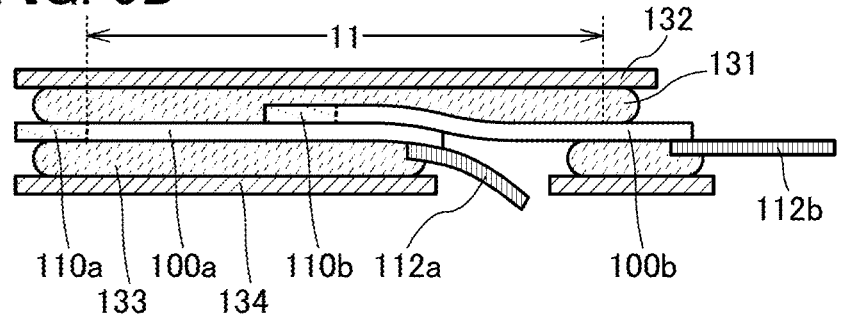

Alternatively, as illustrated in FIGS. 5C and 5D, a resin layer 133 may be provided on a surface opposite to the display surfaces of the display panel 100a and the display panel 100b, and a protective substrate 134 may be provided with the resin layer 133 provided between the protective substrate 134 and each of the display panels 100a and 100b. In this manner, the display panels 100a and 100b are sandwiched between the two protective substrates, whereby the mechanical strength of the display device 10 can be further increased. Furthermore, when the thicknesses of the resin layers 131 and 133 are substantially equal to each other, and for the protective substrates 132 and 134, materials having thicknesses which are substantially equal to each other are used, the plurality of display panels 100 can be located at the center of the stack. For example, when the stack including the display panel 100 is bent, by locating the display panel 100 at the center in the thickness direction, stress in the lateral direction applied to the display panel 100 by bending can be relieved, so that damage can be prevented.

As illustrated in FIGS. 5C and 5D, an opening for extracting the FPC 112a is preferably provided in the resin layer 133 and the protective substrate 134, which are located on the rear surface sides of the display panels 100a and 100b. At this time, by providing the resin layer 133 to cover part of the FPC 112a, the mechanical strength at a connection portion between the display panel 100a and the FPC 112a can be increased, and defects such as peeling of the FPC 112a can be suppressed. Similarly, the resin layer 133 is preferably provided to cover part of the FPC 112b.

Note that the resin layer 133 and the protective substrate 134, which are provided on the side opposite to the display surface, do not necessarily have a light-transmitting property, and a material which absorbs or reflects visible light may be used. When the resin layers 133 and 131, or the protective substrates 134 and 132 have the same materials, manufacturing cost can be reduced.

[Structure Example of Display Region]

Figure 6A:
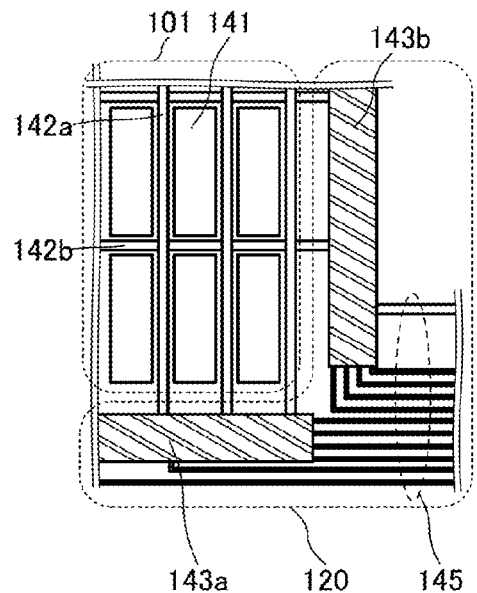
FIGS. 6A to 6C illustrate a display device according to one embodiment.
Figure 6B:
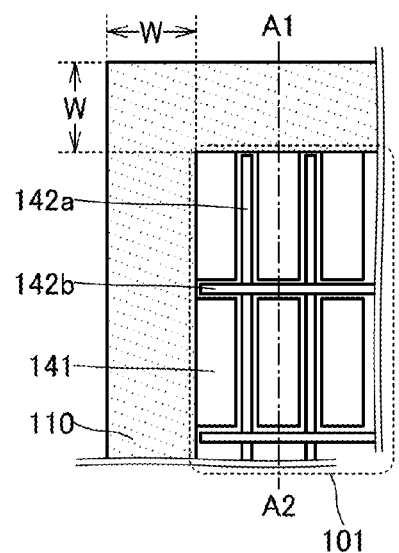

Next, a structure example of the display region 101 of the display panel 100 is described. FIG. 6A is a schematic top view in which a region P in FIG. 2A is enlarged, and FIG. 6B is a schematic top view in which a region Q in FIG. 2A is enlarged.

As illustrated in FIG. 6A, in the display region 101, a plurality of pixels 141 is arranged in matrix. In the case where the display panel 100 which is capable of full color display with three colors of red, blue, and green is formed, the pixel 141 can display any of the three colors. Alternatively, a pixel which can display white or yellow in addition to the three colors may be provided. A region including the pixels 141 corresponds to the display region 101.

A wiring 142a and a wiring 142b are electrically connected to one pixel 141. The plurality of wirings 142a each intersects with the wiring 142b, and is electrically connected to a circuit 143a. The plurality of wirings 142b is electrically connected to a circuit 143b. One of the circuits 143a and 143b can function as a scan line driver circuit, and the other can function as a signal line driver circuit. A structure without one of the circuits 143a and 143b or both of them may be employed.

In FIG. 6A, a plurality of wirings 145 electrically connected to the circuit 143a or the circuit 143b is provided. The wiring 145 is electrically connected to an FPC 123 in an unillustrated region and has a function of supplying a signal from the outside to the circuits 143a and 143b.

In FIG. 6A, a region including the circuit 143a, the circuit 143b, and the plurality of wirings 145 corresponds to the region 120 blocking visible light.

In FIG. 6B, a region outside the pixel 141 provided closest to the end corresponds to the region 110 transmitting visible light. The region 110 does not include the members blocking visible light, such as the pixel 141, the wiring 142a, and the wiring 142b. Note that in the case where part of the pixel 141, the wiring 142a, or the wiring 142b transmits visible light, the part of the pixel 141, the wiring 142a, or the wiring 142b may be provided to extend to the region 110.

Here, the width W of the region 110 indicates the narrowest width of the region 110 provided in the display panel 100 in some cases. In the case where the width W of the display panel 100 varies depending on the positions, the shortest length can be referred to as the width W. In FIG. 6B, the distance between the pixel 141 and the end surface of the substrate (that is, the width W of the region 110) in the vertical direction is the same as that in the horizontal direction.

Figure 6C:
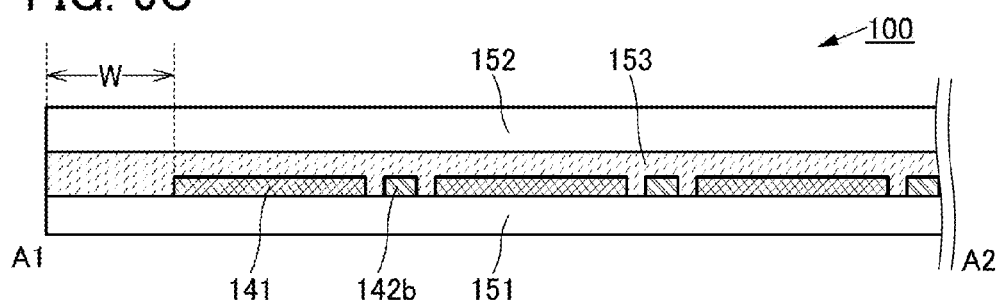

FIG. 6C is a schematic cross-sectional view taken along line A1-A2 in FIG. 6B. The display panels 100 include a pair of light-transmitting substrates (a substrate 151 and a substrate 152). The substrate 151 and the substrate 152 are bonded to each other with a bonding layer 153. Here, the substrate on which the pixel 141, the wiring 142b, and the like are formed is referred to as the substrate 151.

As illustrated in FIGS. 6B and 6C, in the case where the pixel 141 is positioned closest to the end of the display region 101, the width W of the region 110 transmitting visible light is the distance between the end portion of the substrate 151 or the substrate 152 and the end portion of the pixel 141.

Note that the end portion of the pixel 141 refers to the end portion of the member that is positioned closest to the end and blocks visible light in the pixel 141. Alternatively, in the case where a light-emitting element including a layer containing a light-emitting organic compound between a pair of electrodes (also referred to as an organic EL element) is used as the pixel 141, the end portion of the pixel 141 may be any of the end portion of the lower electrode, the end portion of the layer containing a light-emitting organic compound, and the end portion of the upper electrode.

Figure 7A:
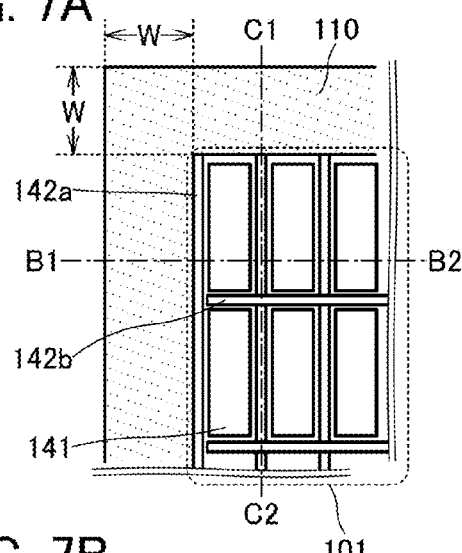
FIGS. 7A to 7C illustrate a display device according to one embodiment.
Figure 7B:
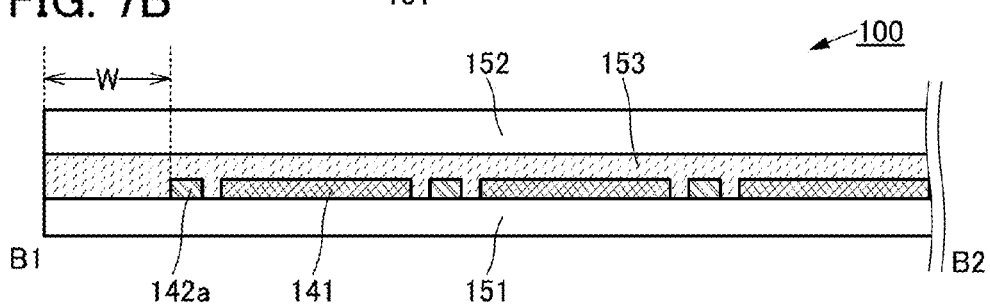

FIG. 7A shows the case where the position of the wiring 142a is different from that in FIG. 6B. FIG. 7B is a schematic cross-sectional view taken along line B1-B2 in FIG. 7A, and FIG. 7C is a schematic cross-sectional view taken along line C1-C2 in FIG. 7A.

Figure 7C:
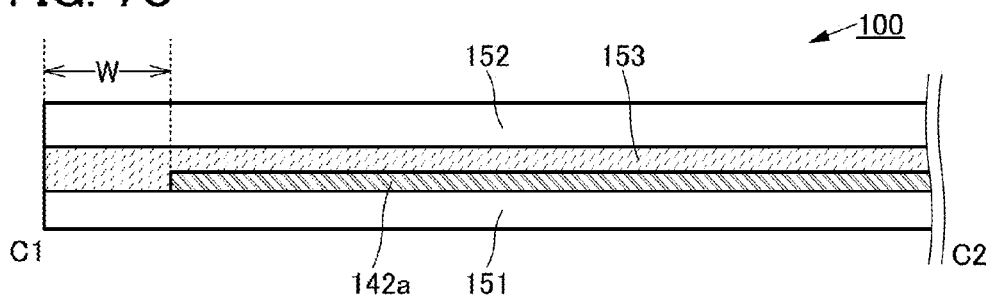

As illustrated in FIGS. 7A to 7C, in the case where the wiring 142a is positioned closest to the end of the display region 101, the width W of the region 110 transmitting visible light is the distance between the end portion of the substrate 151 or the substrate 152 and the end portion of the wiring 142a. In the case where the wiring 142a transmits visible light, the region 110 may include a region where the wiring 142a is provided.

Here, in the case where the density of pixels provided in the display region 101 of the display panel 100 is high, misalignment may occur when the two display panels 100 are bonded.

Figure 8A:
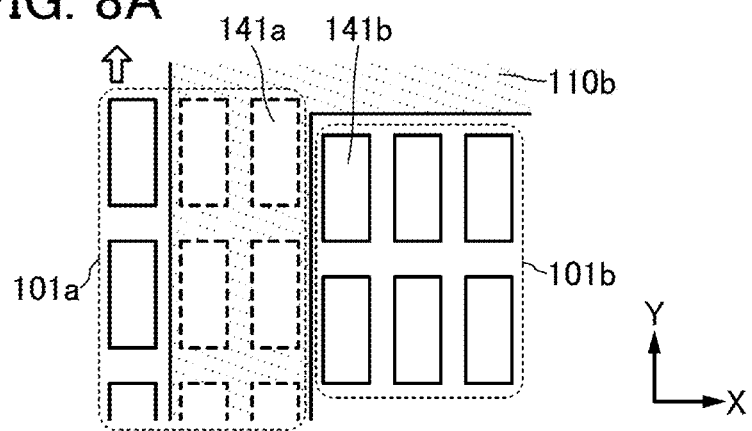
FIGS. 8A to 8C each illustrate a positional relation between display panels according to one embodiment.

FIG. 8A shows a positional relation between the display region 101a of the display panel 100a provided on the lower side and the display region 101b of the display panel 100b provided on the upper side, seen from the display surface side. FIG. 8A shows the vicinities of the corner portions of the display regions 101a and 101b. Part of the display region 101a is covered with the region 110b.

Figure 8B:
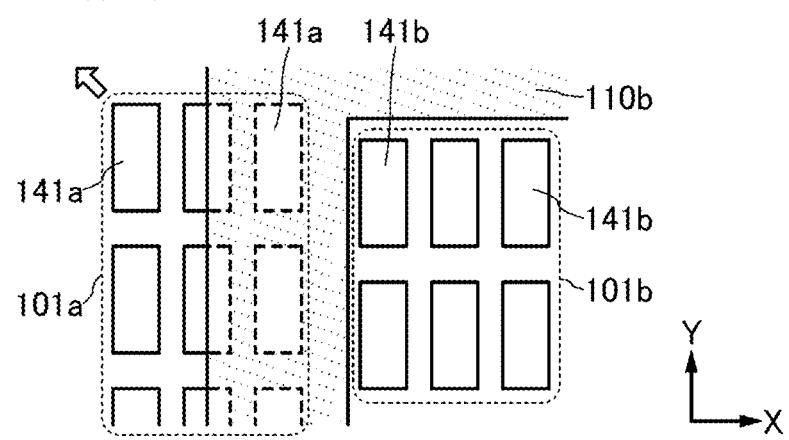

FIG. 8A shows an example in which adjacent pixels 141a and 141b are relatively deviated in one direction (Y direction). The arrow in the drawing denotes a direction in which the display panel 100a is deviated from the display panel 100b. FIG. 8B shows an example in which the adjacent pixels 141a and 141b are relatively deviated in a vertical direction and a horizontal direction (X direction and Y direction).

In the examples of FIGS. 8A and 8B, the distances deviated in the vertical direction and the horizontal direction are each shorter than the length of one pixel. In this case, image data of the image displayed on either one of the display regions 101a and 101b is corrected depending on the deviation distance, whereby the display quality can be maintained. Specifically, when the deviation makes the distance between the pixels smaller, the data is corrected so that the gray level (luminance) of the pixels is low, and when the deviation makes the distance between the pixels larger, the data is corrected so that the gray level (luminance) of the pixels is high. Alternatively, when the two pixels overlap, the data is corrected so that the pixel positioned on a lower side is not driven and the image data is shifted by one column.

Figure 8C:
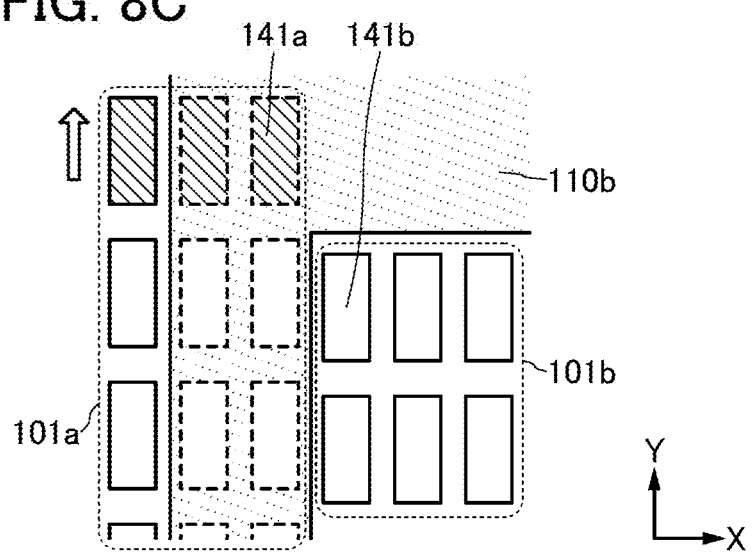

FIG. 8C shows an example in which the pixels 141a and 141b, which should be adjacent, are relatively deviated in one direction (Y direction) by a distance of more than one pixel. When the deviation of more than one pixel occurs, the pixels are driven so that projecting pixels (pixels which are hatched) are not displayed. Note that the same applies to the case where the deviation direction is the X direction.

When the plurality of display panels 100 are bonded, in order to suppress misalignment, each of the display panels 100 is preferably provided with an alignment marker or the like. Alternatively, a projection and a depression may be formed on the surfaces of the display panels 100, and the projection and the depression may be attached to each other in a region where the two display panels 100 overlap.

Furthermore, in consideration of alignment accuracy, it is preferable that pixels more than the pixels to be used be placed in advance in the display region 101 of the display panel 100. For example, it is preferable that one or more, preferably three or more, further preferably five or more extra pixel columns along either one or both of a scan line and a signal line be provided in addition to the pixel columns used for display.

Application Example 1

In the display device 10 of one embodiment of the present invention, by increasing the number of display panels 100, the area of the display region 11 can be increased unlimitedly. Thus, the display device 10 can be favorably used for applications for displaying a large image, such as digital signage and a PID.

Figure 9A:
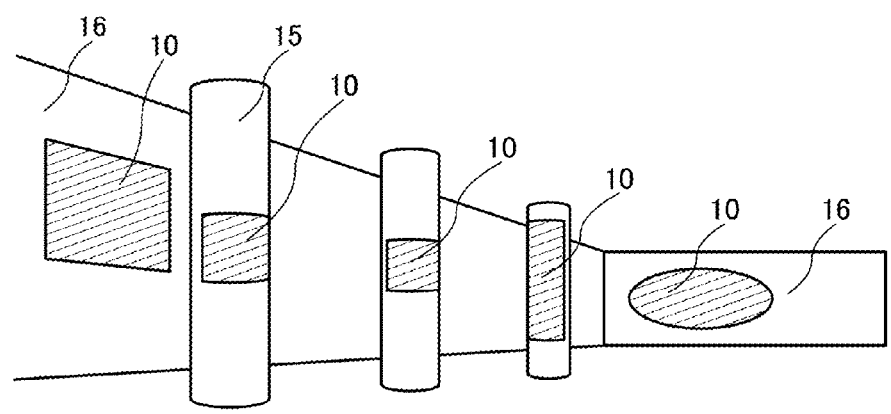
FIGS. 9A and 9B illustrate application examples of a display device according to one embodiment.

FIG. 9A shows an example in which the display device 10 of one embodiment of the present invention is used for a column 15 and a wall 16. A flexible display panel is used as the display panel 100 included in the display device 10, whereby the display device 10 can be placed along a curved surface.

Here, as the number of display panels 100 included in the display device 10 is increased, the circuit size of a wiring board for supplying a signal that drives each display panel 100 is increased. Moreover, as the area of the display device 10 is increased, a longer wiring is needed; thus, signal delay easily occurs, which may adversely affect the display quality.

Thus, each of the plurality of display panels 100 included in the display device 10 is preferably provided with a wireless module that supplies a signal for driving the display panel 100.

Figure 9B:
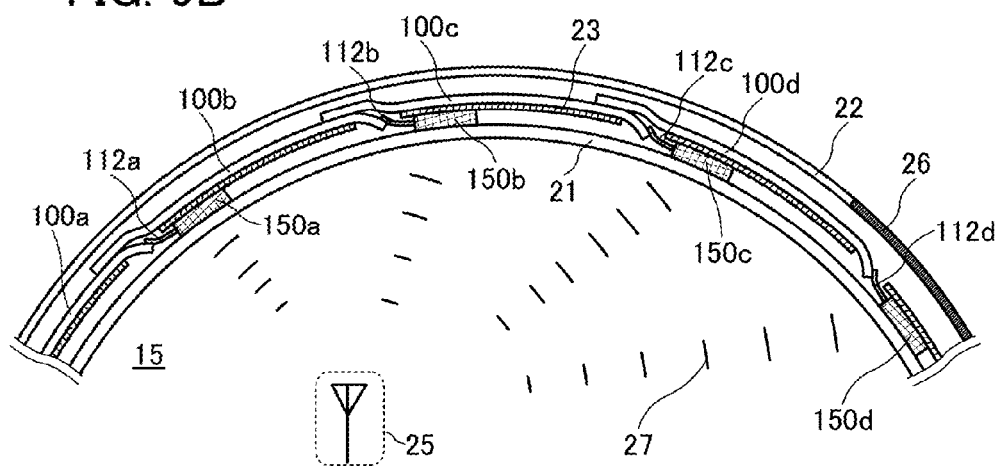

FIG. 9B shows an example of a cross section of the column 15 in the case where the display device 10 is placed on the surface of the cylinder column 15. The display device 10 including the plurality of display panels 100 is placed between an interior member 21 and an exterior member 22 and is curved along the surface of the column 15.

One display panel 100 is electrically connected to the wireless module 150 through the FPC 112. The display panel 100 is supported by the top surface side of a supporting member 23 provided between the interior member 21 and the exterior member 22, and the wireless module 150 is placed on the lower surface side of the supporting member 23. The display panel 100 and the wireless module 150 are electrically connected to each other through the FPC 112 through an opening provided in the supporting member 23.

In FIG. 9B, part of the exterior member 22 is provided with a light-blocking portion 26. The light-blocking portion 26 is provided to cover a region other than the display region of the display device 10, whereby the region cannot be visually recognized by a viewer.

The wireless module 150 receives a wireless signal 27 transmitted from an antenna 25 provided inside or outside the column 15. Furthermore, the wireless module 150 has a function of extracting a signal for driving the display panel 100 from the wireless signal 27 and supplying the signal to the display panel 100. As the signal for driving the display panel 100, the power supply potential, the synchronization signal (the clock signal), the image signal, and the like are given.

For example, each of the wireless modules 150 has an identification number. The wireless signal 27 transmitted from the antenna 25 includes a signal that specifies the identification number and a signal for driving the display panel 100. When the identification number included in the wireless signal 27 corresponds to the identification number of the wireless module 150, the wireless module 150 receives the signal for driving the display panel 100 and supplies the signal to the display panel 100 through the FPC 112; in this manner, different images can be displayed on the respective display panels 100.

The wireless module 150 may be an active wireless module to which power is supplied from the wireless signal 27, or may be a passive wireless module in which a battery and the like are incorporated. In the case of using the passive wireless module, the incorporated battery can be charged by transmitting and receiving electric power (this operation is also referred to as contactless power transmission, non-contact power transmission, wireless power supply, or the like) using an electromagnetic induction method, a magnetic resonance method, an electric wave method, or the like.

With such a structure, even in a large display device 10, the signal for driving each of the display panels 100 is not delayed, and the display quality can be increased. Furthermore, the display device 10 is driven by the wireless signal 27; thus, when the display device 10 is placed on the wall and the column, construction for leading a wiring through the wall and the column, and the like are unnecessary, so that the display device 10 can be easily placed in any locations. For the same reason, the placement position of the display device 10 can be easily changed.

Note that in the above, one wireless module 150 is connected to one display panel 100; however, one wireless module 150 may be connected to two or more display panels 100.

For example, the display device of one embodiment of the present invention includes at least two display panels, and includes at least a first wireless module that extracts a first signal from a received wireless signal and supplies the signal to a first display panel, and a second wireless module that extracts a second signal from the wireless signal and supplies the signal to a second display panel.

Application Example 2

Examples of an electronic device in which the display device 10 of one embodiment of the present invention is used are described below.

Figure 10A:
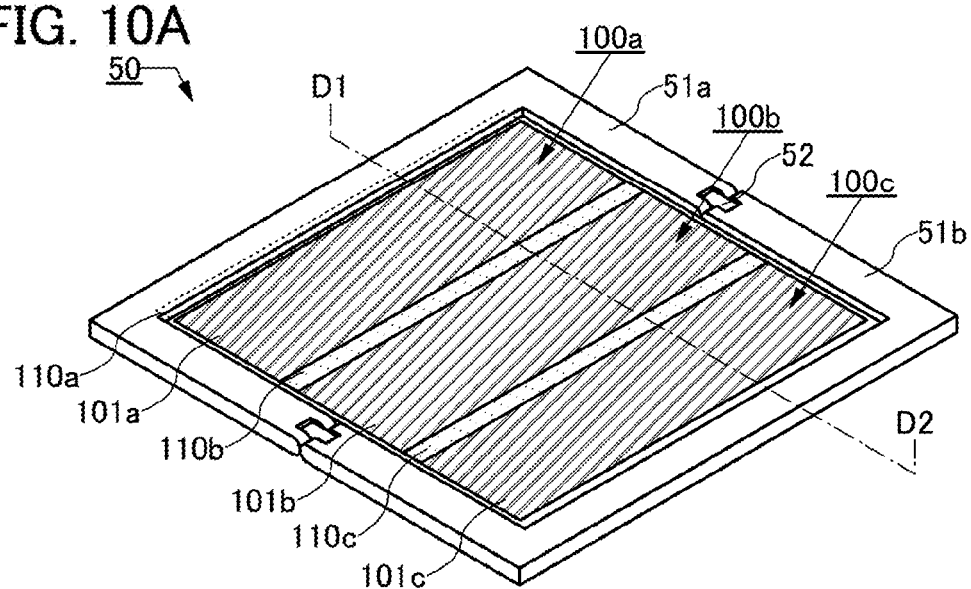
FIGS. 10A and 10B illustrate a structure example of an electronic device including a display device according to one embodiment.
Figure 10B:
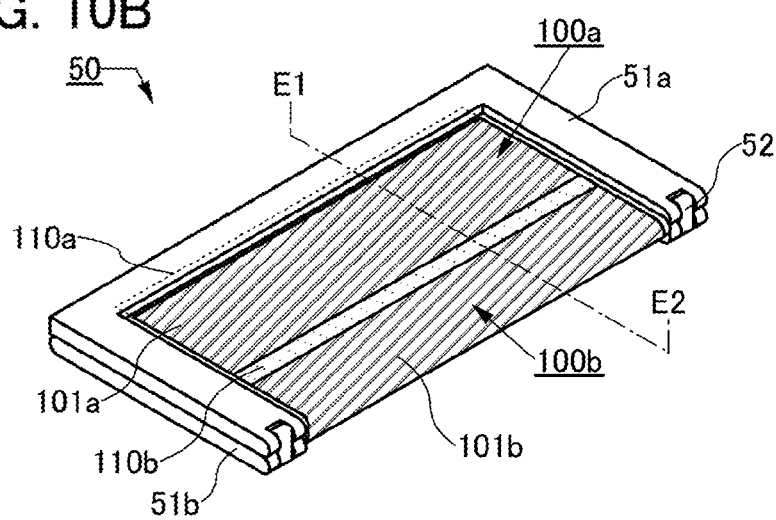

FIGS. 10A and 10B are perspective views of an electronic device 50. The electronic device 50 includes a support 51a, a support 51b, the display panel 100a, the display panel 100b, and the display panel 100c.

The support 51a and the support 51b are rotatably joined to each other by a hinge 52. The display panel 100a is supported by the support 51a. The display panel 100c is supported by the support 51b. Of the three display panels, at least the display panel 100b, which is positioned between the display panel 100a and the display panel 100c, is flexible. The display panel 100a and the display panel 100c need not be flexible; however, when the display panels 100a to 100c have the same structure, mass productivity can be improved.

FIG. 10A shows a state in which the display panel 100a, the display panel 100b, and the display panel 100c are substantially on the same plane (an opened state). FIG. 10B shows a state in which the display panel 100a and the display panel 100c overlap each other (a folded state). The support 51a and the support 51b of the electronic device 50 can be reversibly changed into the opened state or the folded state.

Each of the display panels included in the electronic device 50 preferably includes a touch sensor. For the touch sensor, a variety of types such as a capacitive type, a resistive type, a surface acoustic wave type, an infrared type, and an optical type can be used. In particular, the capacitive type is preferably used. As the touch sensor, an active matrix touch sensor including a transistor and a capacitor is preferably used. A specific structure example of the touch sensor and a touch panel including the touch sensor is described in embodiments below.

The display device included in the electronic device 50 is preferably supported by each support so that the display device can slide. At this time, the display device is preferably supported by each support so that the display device is not moved in the thickness direction. Here, the display device can preferably slide in the direction in which the display device is folded of the directions parallel to the display surface, and the display device is preferably supported by each support so that the display device is not moved in the direction perpendicular to the folded direction. By using this supporting method, when the display device in a flat state is changed into a folded state, misalignment generated in the display device depending on the distance between the neutral plane and the display panel can be corrected by the slide operation. As a result, damage due to stress applied to the display device can be suppressed. Alternatively, one of the plurality of supports and the display device may be fixed not to be slid. Furthermore, part of the display device may have elasticity. Expansion and contraction of part of the display device can correct the misalignment. Furthermore, the display device may be fixed to each support so that the curved portion of the display device loosens in the state where the display device is flat. By the looseness of the display device, the misalignment can be corrected.

A supporting method of the display device included in the electronic device 50 by each support is not particularly limited. For example, when the display device is sandwiched between two members that are processed to have grooves in which the display device can be fitted, the display device can be supported to be slid. In the case where the display device and each support are fixed, for example, an attaching method, a fixing method with screws or the like, a mechanically fixing method in which the display device is sandwiched between members, or the like is used.

In the folded state in FIG. 10B, the display panel 100b includes a folded region so that the display region has a curved surface. Here, it is preferable that a region in which the display panel 100a and the display panel 100b overlap and a region in which the display panel 100b and the display panel 100c overlap be not positioned in the curved region. In particular, in regions 110a, 110b, and 110c of the display panels, which transmit visible light, a belt-shaped portion extending in a direction perpendicular to the direction in which the display device is folded is preferably not positioned in the curved region. A region in which the two display panels overlap has a large thickness and may have a poorer flexibility than the other region; thus, the region is preferably not positioned in the curved portion, whereby the display surface can have a smooth curved surface. Furthermore, when deformation is repeatedly caused in a portion in which the two display panels are bonded to each other, the display panels may be separated from each other. Thus, the portion is not provided in the curved portion, whereby the reliability of the electronic device can be improved.

In the electronic device 50 of one embodiment of the present invention, the display device including the plurality of display panels is supported by the two supports. The display device can be changed in shape, for example, can be bent. For example, the display panel 100b can be bent so that the display surface is placed inward (referred to as inwardly bent) and so that the display surface is placed outward (referred to as outwardly bent). The electronic device 50 of one embodiment of the present invention is highly portable when the display device is in a folded state, and has high browsability in display in an opened state because of a large display region in which joints are not visually recognized. That is, the electronic device 50 is an electronic device in which browsability of display and portability are improved at the same time.

FIG. 11A is a schematic cross-sectional view taken along line D1-D2 in an opened state of the electronic device 50 in FIG. 10A. FIG. 11B is a schematic cross-sectional view taken along line E1-E2 in a folded state of the electronic device 50 in FIG. 10B.

As illustrated in FIGS. 11A and 11B, a substrate 53*a* provided with a terminal 54*a* is included inside the support 51*a*. Similarly, a substrate 53*b* provided with a terminal 54*b* and a terminal 54*c* is included inside the support 51*b*. The display panel 100*a* is electrically connected to the terminal 54*a* through the FPC 112*a*. The display panel 100*b* is electrically connected to the terminal 54*b* through the FPC 112*b*. The display panel 100*c* is electrically connected to the terminal 54*c* through the FPC 112*c*.

Furthermore, as illustrated in FIGS. 11A and 11B, a battery (a battery 55*a* or a battery 55*b*) is preferably included inside each support. When the electronic device 50 includes a plurality of batteries, the charging frequency can be reduced. Alternatively, the capacitance of each battery can be reduced; thus, volume of each battery can decrease to reduce the thicknesses of the support 51*a* and the support 51*b*, and the portability can be improved.

Furthermore, as illustrated in FIG. 11B, in the folded state, the display panel 100*b* is preferably curved along curved surfaces included in the support 51*a* and the support 51*b*. In this manner, in the support 51*a* and the support 51*b*, the surfaces have a curved shape whose curvature radius is appropriate so that a corner portion is not positioned at the surfaces that can be in contact with the display panel 100*b*. As a result, it is possible to prevent the generation of a problem in that the display panel 100*b* is damaged by bending at a curvature radius smaller than an allowable value.

Figure 12A:
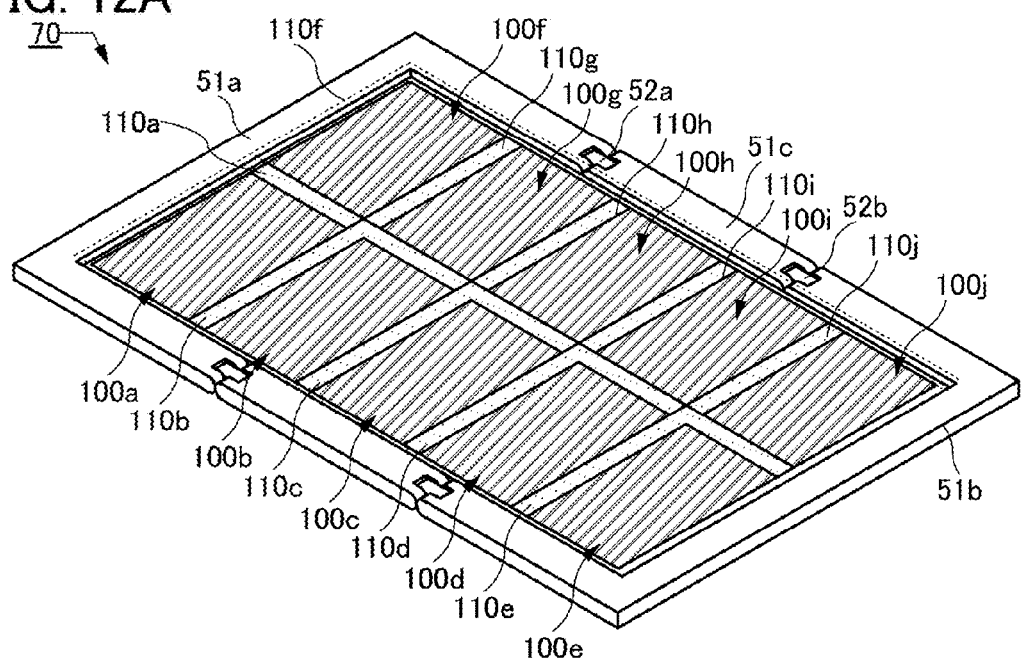
FIGS. 12A and 12B illustrate a structure example of an electronic device including a display device according to one embodiment.
Figure 12B:
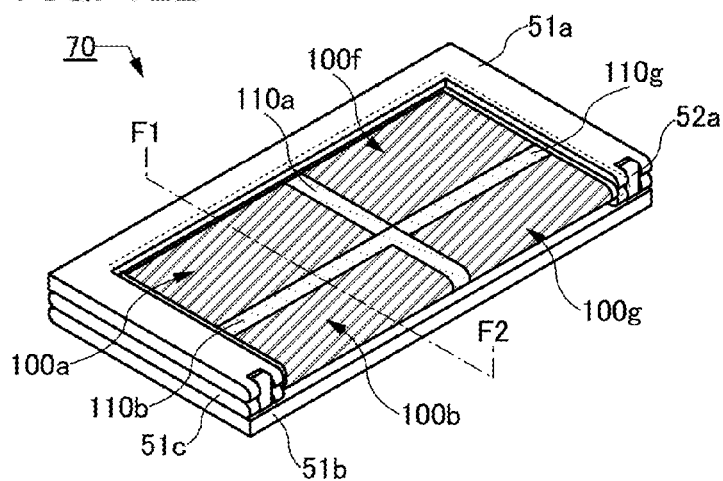

FIGS. 12A and 12B show an electronic device 70 whose structure is different from that of the electronic device 50. The electronic device 70 is mainly different from the electronic device 50 in that a support 51*c* is provided between the support 51*a* and the support 51*b*, and a plurality of display panels (display panels 100*a* to 100*j*) which are arranged in the horizontal and vertical directions are included.

FIG. 12A is a schematic perspective view of the electronic device 70 in the opened state, and FIG. 12B is a schematic perspective view in the folded state.

The support 51*a* and the support 51*c* are rotatably joined to each other by a hinge 52*a*. The support 51*c* and the support 51*b* are rotatably joined to each other by a hinge 52*b*. The display panel 100*a* and the display panel 100*f* are supported by the support 51*a*. The display panel 100*c* and the display panel 100*h* are supported by the support 51*c*. The display panel 100*e* and the display panel 100*j* are supported by the support 51*b*. At least the display panel 100*b*, the display panel 100*d*, the display panel 100*g*, and the display panel 100*i*, which are provided so as to cross over the supports, are flexible.

In the electronic device 70 of one embodiment of the present invention, part of the flexible display device is supported by the three supports. The display device can be changed in the shape, for example, can be folded. For example, the display panel 100*b* and the display panel 100*g* can be folded so that the display surfaces are placed inward (referred to as inwardly bent) and so that the display surfaces are placed outward (referred to as outwardly bent). The electronic device 70 of one embodiment of the present invention is highly portable when the display device is in a folded state, and has high browsability in display in an opened state because of a large display region in which joints are not visually recognized. That is, the electronic device 70 is an electronic device in which browsability of display and portability are improved at the same time.

As illustrated in FIGS. 12A and 12B, it is preferable that a region in which the display panels overlap be not positioned in the curved region. In particular, in regions 110 (regions 110*a* to 110*j*) of the display panels, which transmit visible light, a belt-shaped portion extending in a direction perpendicular to the direction in which the display device is folded is preferably not positioned in the curved region. Furthermore, in regions 110 transmitting visible light, a belt-shaped portion extending in a direction parallel to the direction in which the display device is folded may be positioned in the curved region because the mechanical strength against bending is relatively high.

Figure 13:
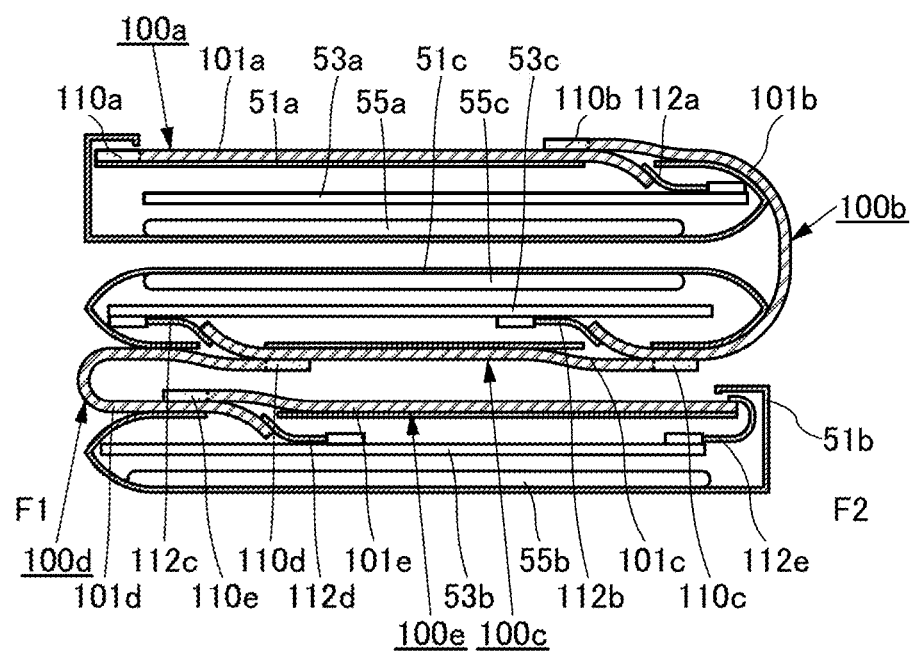
FIG. 13 illustrates a structure example of an electronic device including a display device according to one embodiment.

FIG. 13 is a schematic cross-sectional view taken along line F1-F2 in a folded state of the electronic device 70 in FIG. 12B. The inside of the support 51*c* includes a substrate 53*c* like those of the support 51*a* and the support 51*b*. In addition, a battery 55*c* is preferably included inside the support 51*c*.

The structures of the electronic devices including two or more supports are described above; however, the electronic device may include four or more supports. The area of the display device of one embodiment of the present invention is easily increased; thus, by increasing the number of the supports, the display area in the opened state can be larger. Moreover, the area of one support can be increased.

At least part of this embodiment can be implemented in combination with any of the embodiments described in this specification as appropriate.

Embodiment 2

In this embodiment, a display panel which can be used in a display device of one embodiment of the present invention is described with reference to drawings. Here, as an example of the display panel, a touch panel having a function as a touch sensor is described.

Figure 14A:
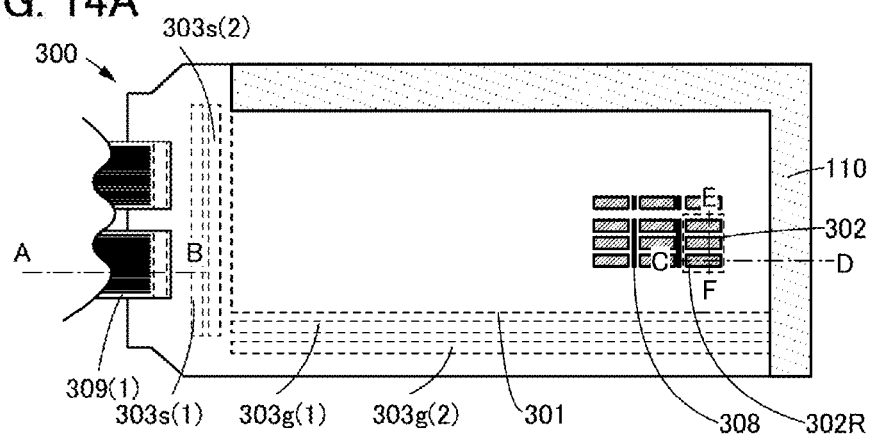
FIGS. 14A to 14C illustrate a touch panel according to one embodiment.
Figure 14B:
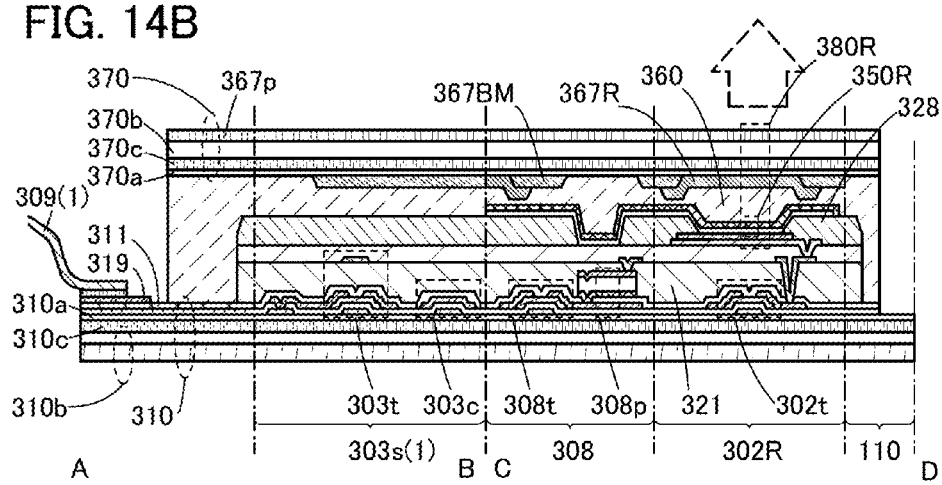
Figure 14C:
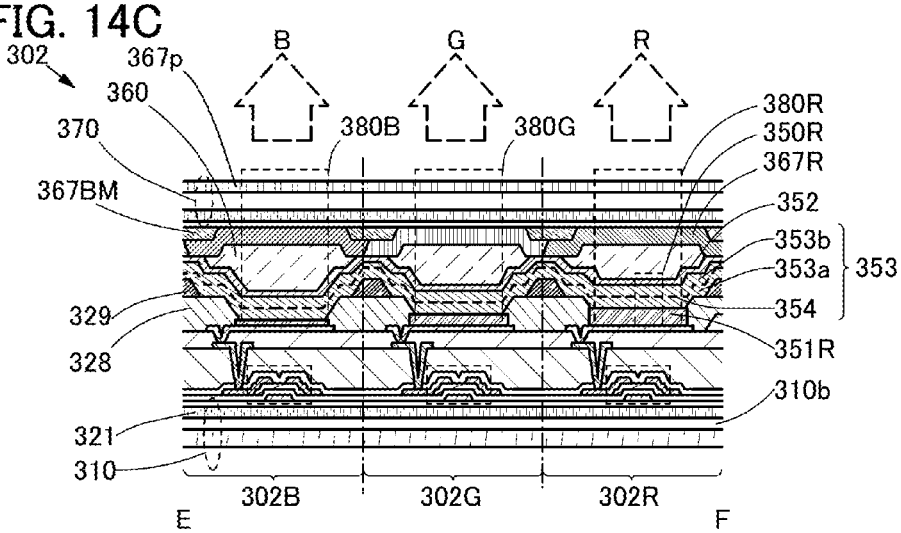

FIG. 14A is a top view illustrating a structure of a touch panel that can be used in a display device of one embodiment of the present invention. FIG. 14B is a cross-sectional view taken along line A-B and line C-D in FIG. 14A. FIG. 14C is a cross-sectional view taken along line E-F in FIG. 14A.

[Top View]

A touch panel 300 described as an example in this embodiment includes a display portion 301 (see FIG. 14A).

The display portion 301 includes a plurality of pixels 302 and a plurality of imaging pixels 308. The imaging pixels 308 can sense a touch of a finger or the like on the display portion 301. A touch sensor can thus be formed using the imaging pixels 308.

Each of the pixels 302 includes a plurality of sub-pixels (e.g., a sub-pixel 302R). In addition, the sub-pixels are provided with light-emitting elements and pixel circuits that can supply electric power for driving the light-emitting elements.

The pixel circuits are electrically connected to wirings through which selection signals are supplied and wirings through which image signals are supplied.

Furthermore, the touch panel 300 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signals include a signal for selecting an imaging pixel circuit from which a recorded imaging signal is read, a signal for initializing an imaging pixel circuit, and a signal for determining the time taken for an imaging pixel circuit to sense light.

The touch panel 300 is provided with an imaging pixel driver circuit 303g(2) that can supply control signals to the imaging pixels 308 and an imaging signal line driver circuit 303s(2) that reads imaging signals.

The touch panel 300 includes the region 110 transmitting visible light along two sides of the display portion 301.
[Cross-Sectional View]

The touch panel 300 includes a substrate 310 and a counter substrate 370 that faces the substrate 310 (see FIG. 14B).

The substrate 310 is a stack in which a flexible substrate 310b, a barrier film 310a that prevents diffusion of impurities to the light-emitting elements, and an adhesive layer 310c that bonds the barrier film 310a to the substrate 310b are stacked.

The counter substrate 370 is a stack including a flexible substrate 370b, a barrier film 370a that prevents diffusion of impurities to the light-emitting elements, and an adhesive layer 370c that attaches the barrier film 370a to the substrate 370b (see FIG. 14B).

A sealant 360 attaches the counter substrate 370 to the substrate 310. The sealant 360 has a refractive index higher than that of air, and serves as a layer which optically attaches two members (here, the counter substrate 370 and the substrate 310) between which the sealant 360 is sandwiched (hereinafter also referred to as an optical adhesive layer). The pixel circuits and the light-emitting elements (e.g., a first light-emitting element 350R) are provided between the substrate 310 and the counter substrate 370.
[Pixel Structure]

Each of the pixels 302 includes a sub-pixel 302R, a sub-pixel 302G, and a sub-pixel 302B (see FIG. 14C). The sub-pixel 302R includes a light-emitting module 380R, the sub-pixel 302G includes a light-emitting module 380G, and the sub-pixel 302B includes a light-emitting module 380B.

For example, the sub-pixel 302R includes the first light-emitting element 350R and a pixel circuit that can supply electric power to the first light-emitting element 350R and includes a transistor 302t (see FIG. 14B). The light-emitting module 380R includes the first light-emitting element 350R and an optical element (e.g., a first coloring layer 367R).

The first light-emitting element 350R includes a lower electrode 351R, an upper electrode 352, and a layer 353 containing a light-emitting organic compound between the lower electrode 351R and the upper electrode 352 (see FIG. 14C).

The layer 353 containing a light-emitting organic compound includes a light-emitting unit 353a, a light-emitting unit 353b, and an intermediate layer 354 between the light-emitting units 353a and 353b.

The light-emitting module 380R includes the first coloring layer 367R on the counter substrate 370. The coloring layer transmits light with a particular wavelength and is, for example, a layer that selectively transmits red, green, or blue light. Alternatively, a region that transmits light emitted from the light-emitting element as it is may be provided.

The light-emitting module 380R, for example, includes the sealant 360 that is in contact with the first light-emitting element 350R and the first coloring layer 367R.

The first coloring layer 367R is positioned in a region overlapping with the first light-emitting element 350R. Accordingly, part of light emitted from the first light-emitting element 350R passes through the sealant 360 that also serves as an optical adhesive layer and through the first coloring layer 367R and is emitted to the outside of the light-emitting module 380R as indicated by arrows in FIGS. 14B and 14C.

Note that although the case where the light-emitting element is used as a display element is described here, one embodiment of the present invention is not limited thereto.

For example, in this specification and the like, a display element, a display device and a display panel, which are devices each including a display element, a light-emitting element, and a light-emitting device, which is a device including a light-emitting element, can employ a variety of modes or can include a variety of elements. The display element, the display device, the display panel, the light-emitting element, or the light-emitting device includes at least one of an electroluminescence (EL) element (e.g., an EL element including organic and inorganic materials, an organic EL element, and an inorganic EL element), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Note that examples of display devices using EL elements include an EL display. Examples of display devices including electron emitters include a field emission display (FED) and an SED-type flat panel display (SED: surface-conduction electron-emitter display). Examples of display devices using liquid crystal elements include a liquid crystal display (e.g., a transmissive liquid crystal display, a transflective liquid crystal display, a reflective liquid crystal display, a direct-view liquid crystal display, and a projection liquid crystal display). Examples of a display device including electronic ink, Electronic Liquid Powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

[Touch Panel Structure]

The touch panel 300 includes a light-blocking layer 367BM on the counter substrate 370. The light-blocking layer 367BM is provided so as to surround the coloring layer (e.g., the first coloring layer 367R).

The touch panel 300 includes an anti-reflective layer 367p positioned in a region overlapping with the display portion 301. As the anti-reflective layer 367p, a circular polarizing plate can be used, for example.

The touch panel 300 includes an insulating film 321. The insulating film 321 covers the transistor 302t. Note that the insulating film 321 can be used as a layer for planarizing unevenness caused by the pixel circuits. An insulating film on which a layer that can prevent diffusion of impurities to the transistor 302t and the like is stacked can be used as the insulating film 321.

The touch panel 300 includes the light-emitting element (e.g., the first light-emitting element 350R) over the insulating film 321.

The touch panel 300 includes, over the insulating film 321, a partition wall 328 that overlaps with an end portion of the lower electrode 351R (see FIG. 14C). In addition, a spacer 329 that controls the distance between the substrate 310 and the counter substrate 370 is provided over the partition wall 328.

[Structure of Image Signal Line Driver Circuit]

The image signal line driver circuit 303s(1) includes a transistor 303t and a capacitor 303c. Note that the driver circuit can be formed in the same process and over the same substrate as those of the pixel circuits. As illustrated in FIG. 14B, the transistor 303t may include a second gate over the insulating film 321. The second gate may be electrically connected to a gate of the transistor 303t, or different potentials may be supplied thereto. The second gate may be provided in a transistor 308t, the transistor 302t, or the like if necessary.

[Structure of Imaging Pixel]

The imaging pixels 308 each include a photoelectric conversion element 308p and an imaging pixel circuit for sensing light received by the photoelectric conversion element 308p. The imaging pixel circuit includes a transistor 308t.

For example, a PIN photodiode can be used as the photoelectric conversion element 308p.

[Structures of Other Components]

The touch panel 300 includes a wiring 311 through which a signal is supplied. The wiring 311 is provided with a terminal 319. Note that an FPC 309(1) through which a signal such as an image signal or a synchronization signal is supplied is electrically connected to the terminal 319.

Note that a printed wiring board (PWB) may be attached to the FPC 309(1).

Transistors formed in the same process can be used as the transistor 302t, the transistor 303t, and the transistor 308t, and the like.

Transistors of a bottom-gate type, a top-gate type, or the like can be used.

As a gate, a source, and a drain of a transistor, and a wiring or an electrode included in a touch panel, a single-layer structure or a layered structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

An oxide semiconductor is preferably used as a semiconductor in which a channel of a transistor such as the transistor 302t, the transistor 303t, or the transistor 308t is formed. In particular, an oxide semiconductor having a wider band gap than silicon is preferably used. A semiconductor material having a wider band gap and a lower carrier density than silicon is preferably used because off-state leakage current of the transistor can be reduced.

The oxide semiconductor preferably contains at least indium (In) or zinc (Zn), for example. The oxide semiconductor further preferably contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film that is caused by stress when a display panel is bent is prevented. Such an oxide semiconductor can thus be preferably used for a flexible display panel that is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

Alternatively, silicon is preferably used as a semiconductor in which a channel of a transistor such as the transistor 302t, the transistor 303t, or the transistor 308t is formed. Although amorphous silicon may be used as silicon, silicon having crystallinity is particularly preferably used. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

Here, a method for forming a flexible light-emitting panel is described.

Here, a structure including a pixel and a driver circuit or a structure including an optical member such as a color filter is referred to as an element layer for convenience. An element layer includes a display element, for example, and may include a wiring electrically connected to a display element or an element such as a transistor used in a pixel or a circuit in addition to the display element.

Here, a support provided with an insulating surface over which an element layer is formed is called a base material.

As a method for forming an element layer over a flexible base material provided with an insulating surface, there are a method in which an element layer is formed directly over a base material, and a method in which an element layer is formed over a supporting base material that has stiffness and then the element layer is separated from the supporting base material and transferred to the base material.

In the case where a material of the base material can withstand heating temperature in the process for forming the element layer, it is preferred that the element layer be formed directly over the base material, in which case a manufacturing process can be simplified. At this time, the element layer is preferably formed in a state where the base material is fixed to the supporting base material, in which case the transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected such that separation at an interface between the supporting base material and the separation layer, at an interface between the separation layer and the insulating layer, or in the separation layer occurs.

For example, it is preferred that a stack of a layer including a high-melting-point metal material, such as tungsten, and a layer including an oxide of the metal material be used as the separation layer, and a stack of a plurality of layers, such as a silicon nitride layer and a silicon oxynitride layer, be used over the separation layer. The use of the high-melting-point metal material is preferable because the degree of freedom of the process for forming the element layer can be increased.

The separation may be performed by application of mechanical power, by etching of the separation layer, by dripping of liquid into part of the separation interface so that it penetrates the entire separation interface, or the like. Alternatively, separation may be performed by heating the separation interface by utilizing a difference in the thermal expansion coefficient.

The separation layer is not necessarily provided in the case where separation can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and separation may be performed at an interface between the glass and the insulating layer. Alternatively, a metal layer may be provided between the supporting base material and the insulating layer formed of an organic resin, and separation may be performed at an interface between the metal layer and the insulating layer by feeding current to the metal layer and heating the metal layer. In that case, the insulating layer formed of an organic resin can be used as a base material.

Examples of such a flexible base material include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low, for example, lower than or equal to $30 \times 10^{-6}$/K is preferably used, and a polyamide imide resin, a polyimide resin, PET, or the like can suitably be used. Alternatively, a substrate in which a fibrous body is impregnated with a resin (also referred to as prepreg) or a substrate whose thermal expansion coefficient is reduced by mixing an inorganic filler with an organic resin can be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Note that for a display device of one embodiment of the present invention, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an metal insulator metal (MIM), a thin film diode (TFD), or the like can be used. Such an element has few numbers of manufacturing steps; thus, the manufacturing cost can be reduced or yield can be improved. Furthermore, because the size of the element is small, the aperture ratio can be improved, so that power consumption can be reduced or higher luminance can be achieved.

As a method other than the active matrix method, the passive matrix method in which an active element (a non-linear element) is not used may be used. Since an active element (a non-linear element) is not used, the number of manufacturing steps is small, so that the manufacturing cost can be reduced or yield can be improved. Furthermore, since an active element (a non-linear element) is not used, the aperture ratio can be improved, so that power consumption can be reduced or higher luminance can be achieved, for example.

Note that an example of the case where a variety of display is performed using the display device is shown here;

however, one embodiment of the present invention is not limited thereto. For example, data is not necessarily displayed. As an example, the display device may be used as a lighting device. By using the device as a lighting device, it can be used as interior lighting having an attractive design. Alternatively, it can be used as lighting with which various directions can be illuminated. Further alternatively, it may be used as a light source, e.g., a backlight or a front light, not the display device. In other words, it may be used as a lighting device for the display panel.

Here, in particular, in the case where the display device of one embodiment of the present invention is used for a television device for home use, digital signage, and a PID, it is preferable to use a touch panel for a display panel as described above because a device with such a structure does not just display a still or moving image, but can be operated by viewers intuitively. In the case where the display device of one embodiment of the present invention is used for advertisement, the effectiveness of the advertisement can be increased. Alternatively, in the case where the display device of one embodiment of the present invention is used for providing information such as route information and traffic information, usability can be enhanced by intuitive operation.

Note that in the case where a display panel does not need to function as a touch sensor, for example, in the case of using the display panel for large advertisements on the walls of buildings, public facilities, and the like, the display panel may have a structure in which the structure of the touch sensor is omitted from the above structure example of the touch panel.

Embodiment 3

In this embodiment, a display panel which can be used in the display device of one embodiment of the present invention is described with reference to drawings.

Here, as an example of the display panel, a touch panel serving as a touch sensor is described.

Figure 15A:
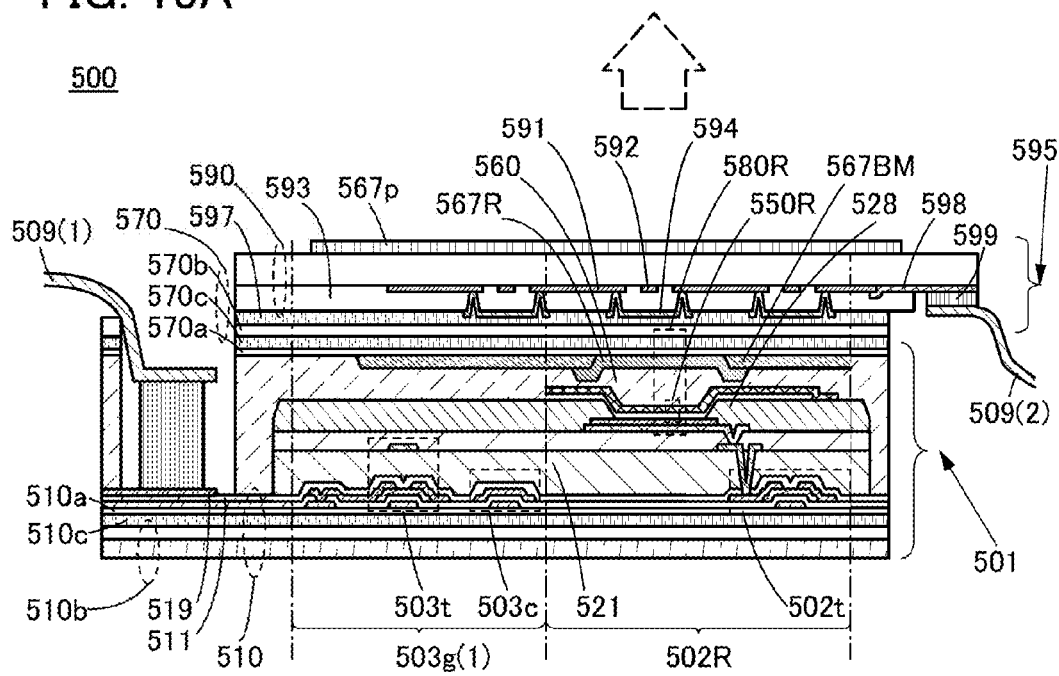
FIGS. 15A to 15C illustrate a touch panel according to one embodiment.
Figure 15B:
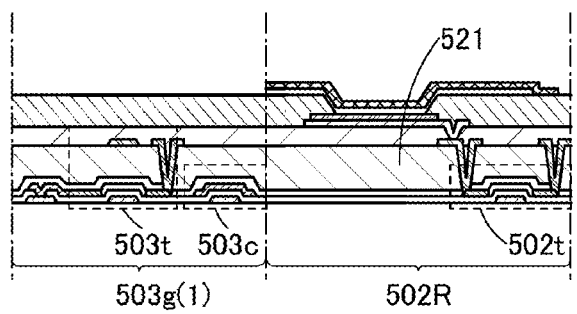
Figure 15C:
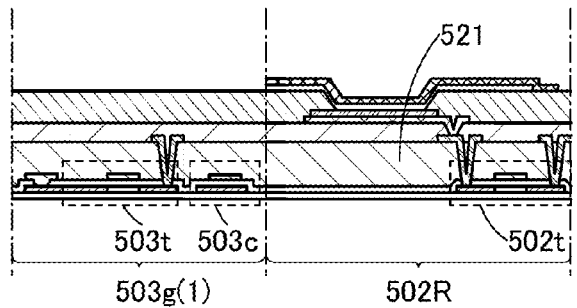

FIGS. 15A to 15C are cross-sectional views of a touch panel 500.

The touch panel 500 includes a display portion 501 and a touch sensor 595. The touch panel 500 further includes a substrate 510, a substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 is led to a peripheral portion of the substrate 510, and part of the plurality of wirings 511 forms a terminal 519. The terminal 519 is electrically connected to an FPC 509(1).
[Touch Sensor]

The substrate 590 includes the touch sensor 595 and a plurality of wirings 598 electrically connected to the touch sensor 595. The plurality of wirings 598 is led to a peripheral portion of the substrate 590, and part of the plurality of wirings 598 forms a terminal. The terminal is electrically connected to an FPC 509(2).

As the touch sensor 595, a capacitive touch sensor can be used. Examples of the capacitive touch sensor include a surface capacitive touch sensor and a projected capacitive touch sensor.

Examples of the projected capacitive touch sensor include a self capacitive touch sensor and a mutual capacitive touch sensor, which differ mainly in the driving method. The use of a mutual capacitive type is preferable because multiple points can be sensed simultaneously.

The case of using a projected capacitive touch sensor will be described below.

Note that the structure of the touch sensor is not limited to the above structure, and a variety of sensors that can sense the proximity or the contact of a sensing target such as a finger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in the luminance of light penetrating the touch sensor 595 can be reduced.

Note that the electrodes 591 and the electrodes 592 can have any of a variety of shapes. For example, the plurality of electrodes 591 may be provided such that space between the electrodes 591 are reduced as much as possible, and the plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, a dummy electrode that is electrically insulated from these electrodes is preferably provided, whereby the area of a region having a different transmittance can be reduced.

The touch sensor 595 includes the substrate 590, the electrodes 591 and the electrodes 592 provided in a staggered arrangement on the substrate 590, an insulating layer 593 covering the electrodes 591 and the electrodes 592, and the wiring 594 that electrically connects the adjacent electrodes 591.

An adhesive layer 597 bonds the substrate 590 to the substrate 570 such that the touch sensor 595 overlaps with the display portion 501.

The electrodes 591 and the electrodes 592 are formed using a light-transmitting conductive material. As the light-transmitting conductive material, a conductive oxide such as indium oxide, indium tin oxide, indium zinc oxide, zinc oxide, or zinc oxide to which gallium is added, or graphene can be used.

The electrodes 591 and the electrodes 592 can be formed by depositing a light-transmitting conductive material on the substrate 590 by a sputtering method and then removing an unnecessary portion by any of various patterning techniques such as photolithography. Graphene can be formed by a CVD method or in such a manner that a solution in which graphene oxide is dispersed is applied and reduced.

Examples of a material for the insulating layer 593 include resins such as acrylic and an epoxy resin, a resin having a siloxane bond, and inorganic insulating materials such as silicon oxide, silicon oxynitride, and aluminum oxide.

Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than those of the electrodes 591 and 592 can be favorably used for the wiring 594 because electric resistance can be reduced.

One electrode 592 extends in one direction, and the plurality of electrodes 592 is provided in the form of stripes.

The wiring 594 intersects with the electrode 592.

Adjacent electrodes 591 are provided with one electrode 592 provided therebetween. The wiring 594 electrically connects the adjacent electrodes 591.

Note that the plurality of electrodes 591 is not necessarily arranged in the direction orthogonal to one electrode 592 and may be arranged to intersect with one electrode 592 at an angle of less than 90 degrees.

One wiring 598 is electrically connected to any of the electrodes 591 and 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

A connection layer 599 electrically connects the wiring 598 to the FPC 509(2).

As the connection layer 599, any of anisotropic conductive films (ACF), anisotropic conductive pastes (ACP), and the like can be used.

The adhesive layer 597 has a light-transmitting property. For example, a thermosetting resin or an ultraviolet curable resin can be used; specifically, an acrylic resin, a urethane resin, an epoxy resin, or a resin having a siloxane bond can be used.

Note that the FPC 509(2), the light-blocking wiring electrically connected to the FPC 509(2), and the like may be placed not to overlap with the region 110 transmitting visible light.

[Display Portion]

The display portion 501 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

Other than organic electroluminescent elements, for example, any of various display elements such as display elements (electronic ink) that perform display by an electrophoretic method, an electronic liquid powder (registered trademark) method, or the like; MEMS shutter display elements; and optical-interference-type MEMS display elements can be used. Note that a structure suitable for employed display elements can be selected from among a variety of structures of pixel circuits.

The substrate 510 is a stack in which a flexible substrate 510b, a barrier film 510a that prevents diffusion of impurities to light-emitting elements, and an adhesive layer 510c that bonds the barrier film 510a to the substrate 510b are stacked.

The substrate 570 is a stack in which a flexible substrate 570b, a barrier film 570a that prevents diffusion of impurities to the light-emitting elements, and an adhesive layer 570c that bonds the barrier film 570a to the substrate 570b are stacked.

A sealant 560 bonds the substrate 570 to the substrate 510. The sealant 560 has a refractive index higher than that of air. In the case of extracting light to the sealant 560 side, the sealant 560 serves as an optical adhesive layer. The pixel circuits and the light-emitting elements (e.g., a first light-emitting element 550R) are provided between the substrate 510 and the substrate 570.

[Pixel Structure]

The pixel includes a sub-pixel 502R, and the sub-pixel 502R includes a light-emitting module 580R.

The sub-pixel 502R includes the first light-emitting element 550R and the pixel circuit that can supply electric power to the first light-emitting element 550R and includes a transistor 502t. The light-emitting module 580R includes the first light-emitting element 550R and an optical element (e.g., a first coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light with a particular wavelength and is, for example, a layer that selectively transmits red, green, or blue light. Note that in another sub-pixel, a region that transmits light emitted from the light-emitting element as it is may be provided.

In the case where the sealant 560 is provided on the light extraction side, the sealant 560 is in contact with the first light-emitting element 550R and the first coloring layer 567R.

The first coloring layer 567R is positioned in a region overlapping with the first light-emitting element 550R. Accordingly, part of light emitted from the first light-emitting element 550R passes through the first coloring layer 567R and is emitted to the outside of the light-emitting module 580R as indicated by an arrow in FIG. 15A.

[Structure of Display Portion]

The display portion 501 includes a light-blocking layer 567BM on the light extraction side. The light-blocking layer 567BM is provided so as to surround the coloring layer (e.g., the first coloring layer 567R).

The display portion 501 includes an anti-reflective layer 567p positioned in a region overlapping with the pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness due to the pixel circuit. A layered film including a layer that can prevent diffusion of impurities can be used as the insulating film 521. This can prevent decrease of the reliability of the transistor 502t or the like due to diffusion of impurities.

The display portion 501 includes the light-emitting elements (e.g., the first light-emitting element 550R) over the insulating film 521.

The display portion 501 includes, over the insulating film 521, a partition wall 528 that overlaps with an end portion of the first lower electrode. In addition, a spacer that controls the distance between the substrate 510 and the substrate 570 is provided over the partition wall 528.

[Configuration of Scan Line Driver Circuit]

A scan line driver circuit 503g(1) includes a transistor 503t and a capacitor 503c. Note that the driver circuit can be formed in the same process and over the same substrate as those of the pixel circuits.

[Structures of Other Components]

The display portion 501 includes the wirings 511 through which signals are supplied. The wirings 511 are provided with the terminal 519. Note that the FPC 509(1) through which a signal such as an image signal or a synchronization signal are supplied is electrically connected to the terminal 519.

Note that a printed wiring board (PWB) may be attached to the FPC 509(1).

[Modification Example of Display Portion]

Any of various kinds of transistors can be used in the display portion 501.

FIGS. 15A and 15B illustrate a structure in which bottom-gate transistors are used in the display portion 501.

For example, a semiconductor layer containing an oxide semiconductor, amorphous silicon, or the like can be used in the transistor 502$t$ and the transistor 503$t$ illustrated in FIG. 15A.

For example, a semiconductor layer containing polycrystalline silicon or the like can be used in the transistor 502$t$ and the transistor 503$t$ illustrated in FIG. 15B.

A structure of the case where top-gate transistors are used in the display portion 501 is illustrated in FIG. 15C.

For example, a semiconductor layer containing an oxide semiconductor, polycrystalline silicon, a transferred single crystal silicon film, or the like can be used in the transistor 502$t$ and the transistor 503$t$ in FIG. 15C.

At least part of this embodiment can be implemented in combination with any of the other embodiments described in this specification as appropriate.

Embodiment 4

In this embodiment, a display panel which can be used in a display device of one embodiment of the present invention is described with reference to drawings. Here, as an example of the display panel, a touch panel serving as a touch sensor is described.

Figure 16A:
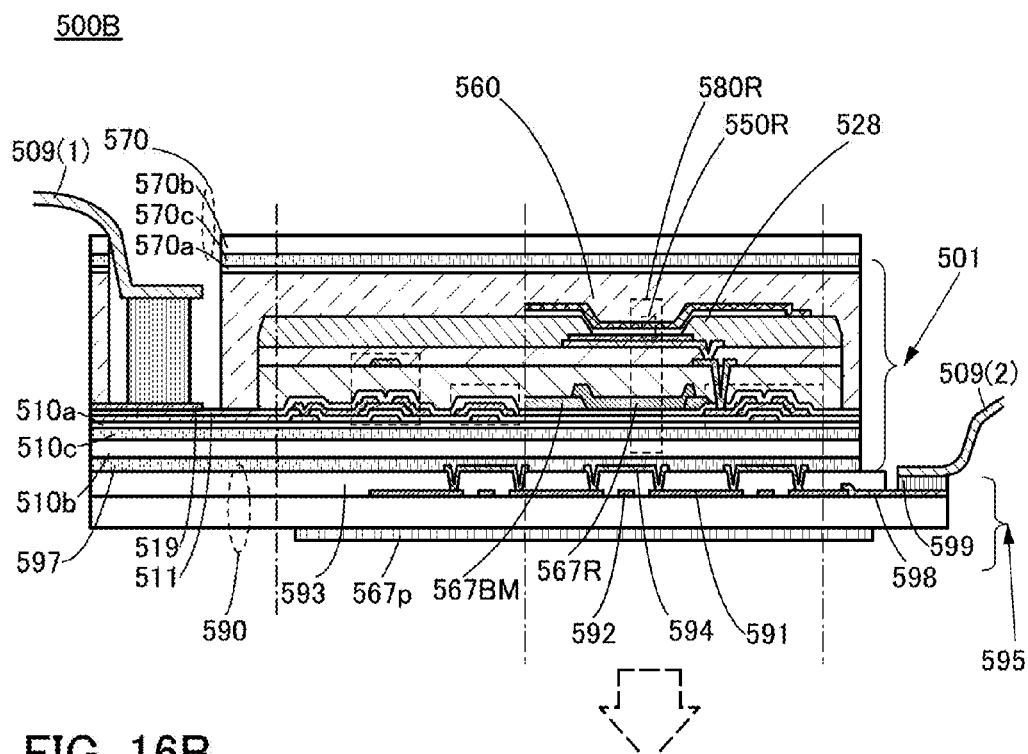
FIGS. 16A to 16C illustrate a touch panel according to one embodiment.
Figure 16B:
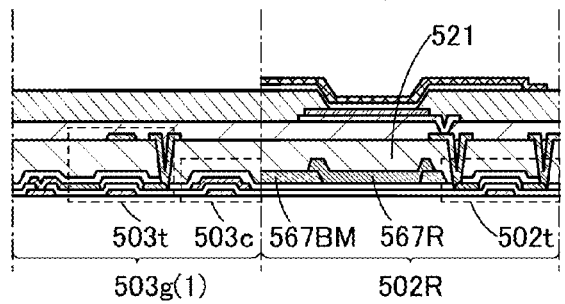
Figure 16C:
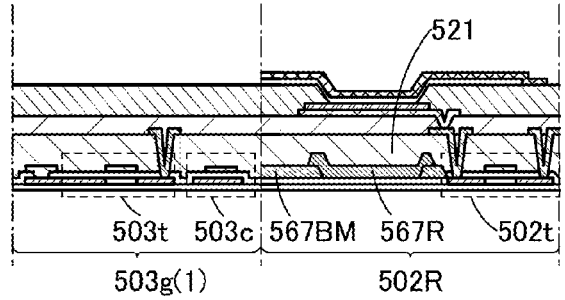

FIGS. 16A to 16C are cross-sectional views of a touch panel 500B.

The touch panel 500B described in this embodiment is different from the touch panel 500 described in Embodiment 3 in that the display portion 501 displays received image data to the side where the transistors are provided and that the touch sensor is provided on the substrate 510 side of the display portion. Different structures will be described in detail below, and the above description is referred to for the other similar structures.

[Display Portion]

The display portion 501 includes a plurality of pixels arranged in a matrix. Each of the pixels includes a display element and a pixel circuit for driving the display element.

[Pixel Structure]

A pixel includes a sub-pixel 502R, and the sub-pixel 502R includes a light-emitting module 580R.

The sub-pixel 502R includes the first light-emitting element 550R and the pixel circuit that can supply electric power to the first light-emitting element 550R and includes a transistor 502$t$.

The light-emitting module 580R includes the first light-emitting element 550R and an optical element (e.g., the first coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light with a particular wavelength and is, for example, a layer that selectively transmits red, green, or blue light. Note that in another sub-pixel, a region that transmits light emitted from the light-emitting element as it is may be provided.

The first coloring layer 567R is positioned in a region overlapping with the first light-emitting element 550R. The first light-emitting element 550R illustrated in FIG. 16A emits light to the side where the transistor 502$t$ is provided. Accordingly, part of light emitted from the first light-emitting element 550R passes through the first coloring layer 567R and is emitted to the outside of the light-emitting module 580R as indicated by an arrow in FIG. 16A.

[Structure of Display Portion]

The display portion 501 includes a light-blocking layer 567BM on the light extraction side. The light-blocking layer 567BM is provided so as to surround the coloring layer (e.g., the first coloring layer 567R).

The display portion 501 includes an insulating film 521. The insulating film 521 covers the transistor 502$t$. Note that the insulating film 521 can be used as a layer for planarizing unevenness due to the pixel circuit. A layered film including a layer that can prevent diffusion of impurities can be used as the insulating film 521. This can prevent the decrease of the reliability of the transistor 502$t$ or the like due to diffusion of impurities from the coloring layer 567R.

[Touch Sensor]

The touch sensor 595 is provided on the substrate 510 side of the display portion 501 (see FIG. 16A).

The adhesive layer 597 is provided between the substrate 510 and the substrate 590 and bonds the touch sensor 595 to the display portion 501.

Note that the FPC 509(2), the light-blocking wiring electrically connected to the FPC 509(2), and the like may be placed not to overlap with the region 110 transmitting visible light.

Modification Example 1 of Display Portion

Any of various kinds of transistors can be used in the display portion 501.

FIGS. 16A and 16B illustrate a structure of the case where bottom-gate transistors are used in the display portion 501.

For example, a semiconductor layer containing an oxide semiconductor, amorphous silicon, or the like can be used in the transistor 502$t$ and the transistor 503$t$ illustrated in FIG. 16A.

For example, a semiconductor layer containing polycrystalline silicon or the like can be used in the transistor 502$t$ and the transistor 503$t$ illustrated in FIG. 16B.

FIG. 16C illustrates a structure of the case where top-gate transistors are used in the display portion 501.

For example, a semiconductor layer containing an oxide semiconductor, polycrystalline silicon, a transferred single crystal silicon film, or the like can be used in the transistor 502$t$ and the transistor 503$t$ illustrated in FIG. 16C.

At least part of this embodiment can be implemented in combination with any of the other embodiments described in this specification as appropriate.

Embodiment 5

In this embodiment, a structure of an input/output device of one embodiment of the present invention is described with reference to FIGS. 17A to 17C and FIG. 18.

Figure 17A:
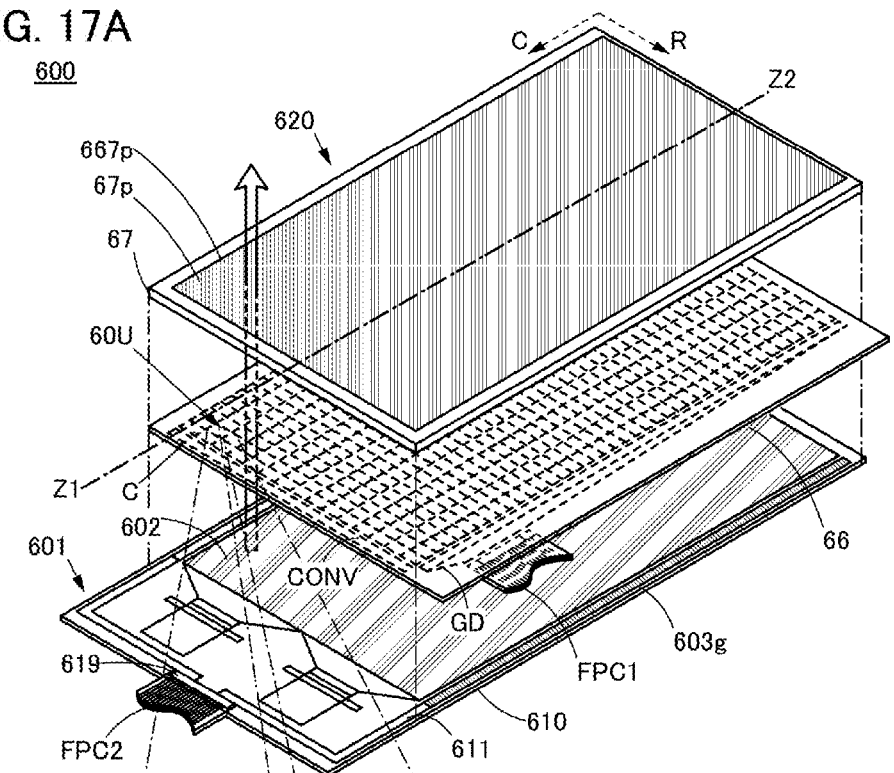
FIGS. 17A to 17C are projection drawings illustrating a structure of an input/output device according to one embodiment.
Figure 17B:
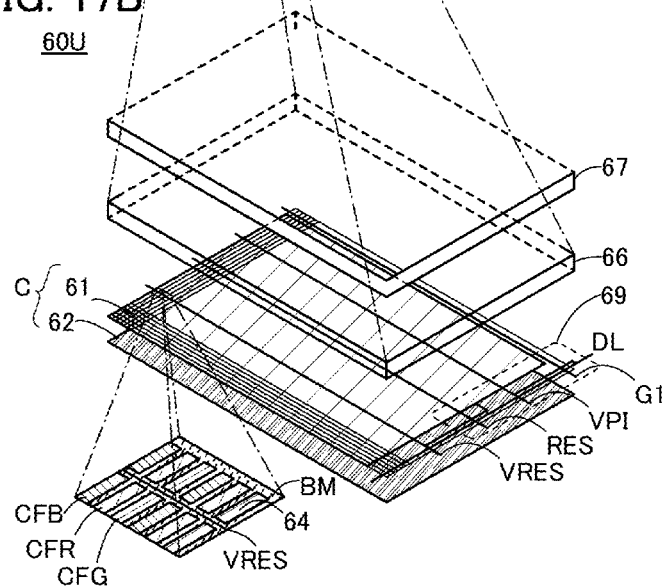
Figure 17C:
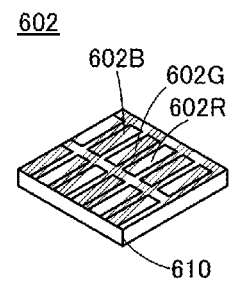

FIGS. 17A to 17C are projection drawings illustrating a structure of an input/output device of one embodiment of the present invention.

FIG. 17A is a projection drawing of an input/output device 600 of one embodiment of the present invention, and FIG. 17B is a projection drawing illustrating a structure of a sensor unit 60U included in the input/output device 600.

Figure 18:
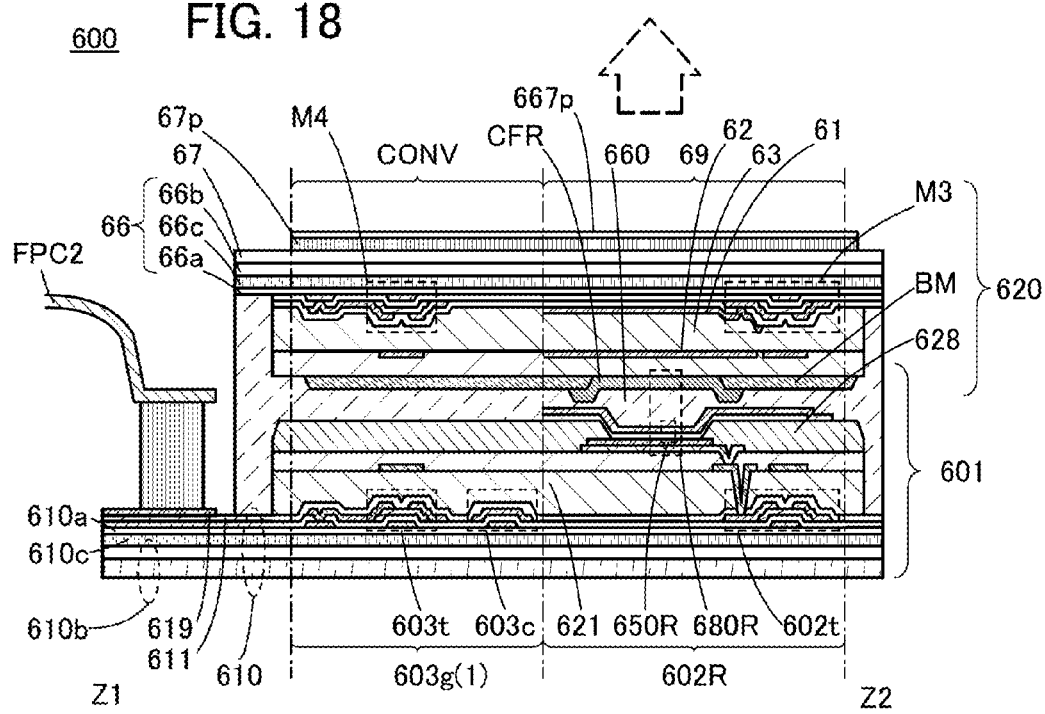
FIG. 18 is a cross-sectional view illustrating a structure of an input/output device according to one embodiment.

FIG. 18 is a cross-sectional view illustrating a structure of the input/output device 600 of one embodiment of the present invention.

FIG. 18 is a cross-sectional view taken along line Z1-Z2 of the input/output device 600 of one embodiment of the present invention in FIG. 17A.

Note that the input/output device 600 can be a touch panel.

[Structure Example of Input/Output Device]

The input/output device 600 described in this embodiment includes a flexible input device 620 and a display portion 601. The flexible input device 620 includes a plurality of sensor units 60U arranged in matrix and each provided with window portions 64 transmitting visible light, a scan line G1 electrically connected to a plurality of sensor units 60U placed in the row direction (indicated by arrow R in the drawing), a signal line DL electrically connected to a plurality of sensor units 60U placed in the column direction (indicated by arrow C in the drawing), and a flexible first base material 66 supporting the sensor unit 60U, the scan line G1, and the signal line DL. The display portion 601 includes a plurality of pixels 602 overlapping with the window portions 64 and arranged in matrix and a flexible second base material 610 supporting the pixels 602 (see FIGS. 17A to 17C).

The sensor unit 60U includes a sensor element C overlapping with the window portion 64 and a sensor circuit 69 electrically connected to the sensor element C (see FIG. 17B).

The sensor element C includes an insulating layer 63, and a first electrode 61 and a second electrode 62 between which the insulating layer 63 is sandwiched (see FIG. 18).

A selection signal is supplied to the sensor circuit 69, and the sensor circuit 69 supplies a sensor signal DATA based on the change in capacitance of the sensor element C.

The scan line G1 can supply the selection signal, the signal line DL can supply the sensor signal DATA, and the sensor circuit 69 is placed to overlap with gaps between the plurality of window portions 64.

In addition, the input/output device 600 described in this embodiment includes a coloring layer between the sensor unit 60U and the pixel 602 overlapping with the window portion 64 of the sensor unit 60U.

The input/output device 600 described in this embodiment includes the flexible input device 620 including the plurality of sensor units 60U, each of which is provided with the window portions 64 transmitting visible light, and the flexible display portion 601 including the plurality of pixels 602 overlapping with the window portions 64. The coloring layer is included between the window portion 64 and the pixel 602.

With such a structure, the input/output device can supply a sensor signal based on the change in the capacitance and positional information of the sensor unit supplying the sensor signal, can display image data relating to the positional information of the sensor unit, and can be bent. As a result, a novel input/output device with high convenience or high reliability can be provided.

The input/output device 600 may include a flexible substrate FPC 1 to which a signal from the input device 620 is supplied and/or a flexible substrate FPC 2 supplying a signal including image data to the display portion 601.

In addition, a protective layer 67p protecting the input/output device 600 by preventing damage and/or an anti-reflective layer 667p that weakens the intensity of external light reflected by the input/output device 600 may be included.

Moreover, the input/output device 600 includes a scan line driver circuit 603g which supplies the selection signal to a scan line of the display portion 601, a wiring 611 supplying a signal, and a terminal 619 electrically connected to the flexible substrate FPC 2.

Components of the input/output device 600 are described below. Note that these components cannot be clearly distinguished and one component also serves as another component or include part of another component in some cases.

For example, the input device 620 including the coloring layer overlapping with the plurality of window portions 64 also serves as a color filter.

Furthermore, for example, the input/output device 600 in which the input device 620 overlaps the display portion 601 serves as the input device 620 as well as the display portion 601.

<<Whole Structure>>

The input/output device 600 includes the input device 620 and the display portion 601 (see FIG. 17A).

<<Input Device 620>>

The input device 620 includes the plurality of sensor units 60U and the flexible base material 66 supporting the sensor units. For example, the plurality of sensor units 60U is arranged in matrix with 40 rows and 15 columns on the flexible base material 66.

<<Window Portion 64, Coloring Layer, and Light-Blocking Layer BM>>

The window portion 64 transmits visible light.

A coloring layer transmitting light of a predetermined color is provided to overlap with the window portion 64. For example, a coloring layer CFB transmitting blue light, a coloring layer CFG transmitting green light, and a coloring layer CFR transmitting red light are included (see FIG. 17B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a pigment, dye, or the like can be used.

A light-blocking layer BM is provided to surround the window portions 64. The light-blocking layer BM does not easily transmit light as compared to the window portion 64.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 69 are provided to overlap with the light-blocking layer BM.

Note that a light-transmitting overcoat layer covering the coloring layer and the light-blocking layer BM can be provided.

<<Sensor Element C>>

The sensor element C includes the first electrode 61, the second electrode 62, and the insulating layer 63 between the first electrode 61 and the second electrode 62 (see FIG. 18).

The first electrode 61 is formed apart from other regions, for example, is formed into an island shape. A layer that can be formed in the same process as that of the first electrode 61 is preferably placed close to the first electrode 61 so that the user of the input/output device 600 does not recognize the first electrode 61. Further preferably, the number of the window portions 64 placed in the gap between the first electrode 61 and the layer placed close to the first electrode 61 is reduced as much as possible. In particular, the window portion 64 is preferably not placed in the gap.

The second electrode 62 is provided to overlap with the first electrode 61, and the insulating layer 63 is provided between the first electrode 61 and the second electrode 62.

When an object whose dielectric constant is different from that of the air gets closer to the first electrode 61 or the second electrode 62 of the sensor element C that is put in the air, the capacitance of the sensor element C is changed. Specifically, when a finger or the like gets closer to the sensor element C, the capacitance of the sensor element C is changed. Accordingly, the sensor element C can be used in a proximity sensor.

Alternatively, the capacitance of the sensor element C that can be changed in shape is changed depending on the change in shape.

Specifically, when a finger or the like is in contact with the sensor element C, and the gap between the first electrode 61 and the second electrode 62 becomes small, the capacitance of the sensor element C is increased. Accordingly, the sensor element C can be used in a tactile sensor.

Furthermore, when the sensor element C is bent, and the gap between the first electrode 61 and the second electrode 62 becomes small, the capacitance of the sensor element C is increased. Accordingly, the sensor element C can be used in a bend sensor.

The first electrode 61 and the second electrode 62 include a conductive material.

For example, an inorganic conductive material, an organic conductive material, a metal material, a conductive ceramic material, or the like can be used for the first electrode 61 and the second electrode 62.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used.

Alternatively, a conductive oxide such as indium oxide, indium tin oxide, indium zinc oxide, zinc oxide, or zinc oxide to which gallium is added can be used.

Alternatively, graphene or graphite can be used. The film including graphene can be formed, for example, by reducing a film containing graphene oxide. As a reducing method, a method with application of heat, a method using a reducing agent, or the like can be employed.

Alternatively, a conductive polymer can be used.

<<Sensor Circuit 69>>

The sensor circuit 69 includes transistors M1 to M3. In addition, the sensor circuit 69 includes wirings supplying a power supply potential and a signal. For example, the signal line DL, the wiring VPI, a wiring CS, the scan line G1, the wiring RES, and the wiring VRES are included. Note that the specific structure example of the sensor circuit 69 is described in detail in Embodiment 6.

Note that the sensor circuit 69 may be placed not to overlap with the window portion 64. For example, a wiring is placed not to overlap with the window portion 64, whereby one side of the sensor unit 60U can be visually recognized easily from the other side of the sensor unit 60U.

Transistors that can be formed in the same process can be used as the transistors M1 to M3.

The transistor M1 includes a semiconductor layer. For example, for the semiconductor layer, an element belonging to group 4, a compound semiconductor, or an oxide semiconductor can be used. Specifically, a semiconductor containing silicon, a semiconductor containing gallium arsenide, an oxide semiconductor containing indium, or the like can be used.

A structure of a transistor in which an oxide semiconductor is used for a semiconductor layer is described in detail in Embodiment 6.

For the wiring, a conductive material can be used.

For example, an inorganic conductive material, an organic conductive material, a metal material, a conductive ceramic material, or the like can be used for the wiring. Specifically, a material which is the same as those of the first electrode 61 and the second electrode 62 can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 69 may be formed on the base material 66 by processing a film formed over the base material 66.

Alternatively, the sensor circuit 69 formed on another base material may be transferred to the base material 66.

Note that a manufacturing method of the sensor circuit is described in detail in Embodiment 6.

<<Base Material 66>>

For the flexible base material 66, an organic material, an inorganic material, or a composite material of an organic material and an inorganic material can be used.

For the base material 66, a material with a thickness of 5 µm or more and 2500 µm or less, preferably 5 µm or more and 680 µm or less, further preferably 5 µm or more and 170 µm or less, further preferably 5 µm or more and 45 µm or less, further preferably 8 µm or more and 25 µm or less can be used.

Furthermore, a material with which passage of impurities is inhibited can be preferably used for the base material 66. For example, materials with a vapor permeability of lower than or equal to $10^{-5}$ g/m²·day, preferably lower than or equal to $10^{-6}$ g/m²·day can be favorably used.

Furthermore, materials whose coefficients of linear expansion are substantially equal to each other can be preferably used as the materials included in the base material 66. For example, the coefficient of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

Examples of the material of the base material 66 are organic materials such as a resin, a resin film, and a plastic film.

Examples of the material of the base material 66 are inorganic materials such as a metal plate and a thin glass plate with a thickness of 10 µm or more and 50 µm or less.

An example of the material of the base material 66 is a composite material such as a resin film to which a metal plate, a thin glass plate, or a film of an inorganic material is attached with the use of a resin layer.

An example of the material of the base material 66 is a composite material such as a resin or a resin film into which a fibrous or particulate metal, glass, or inorganic material is dispersed.

The resin layer can be formed using a thermosetting resin or an ultraviolet curable resin.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, a silicon oxide film, a silicon nitride film, a silicon oxynitride film, an alumina film, or the like can be used.

Specifically, SUS, aluminum, or the like in which an opening portion is provided can be used.

Specifically, an acrylic resin, a urethane resin, an epoxy resin, or a resin having a siloxane bond can be used.

For example, a stack in which a flexible base material 66b, a barrier film 66a that prevents diffusion of impurities, and a resin layer 66c attaching the barrier film 66a to the base material 66b are stacked can be preferably used for the base material 66 (see FIG. 18).

Specifically, a film containing a stacked-layer material of a 600-nm-thick silicon oxynitride film and a 200-nm-thick silicon nitride film can be used as the barrier film 66a.

Alternatively, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the barrier film 66a.

A resin film or resin plate of polyester, polyolefin, polyamide, polyimide, polycarbonate, an acrylic resin, or the like, a stack of two or more of the above materials, or the like can be used as the base material 66b.

For example, a material that includes polyester, polyolefin, polyamide (e.g., nylon, aramid), polyimide, polycarbonate, an acrylic resin, a urethane resin, an epoxy resin, or a resin having a siloxane bond can be used for the resin layer 66c.

<<Protective Base Material 67, Protective Layer 67p>>

A flexible protective base material 67 and/or the protective layer 67p can be provided. The flexible protective base material 67 or the protective layer 67p protects the input device 620 by preventing damage.

For example, a resin film or resin plate of polyester, polyolefin, polyamide, polyimide, polycarbonate, an acrylic resin, or the like, a stack of two or more of the above materials, or the like can be used as the protective base material 67.

For example, a hard coat layer or a ceramic coat layer can be used as the protective layer 67p. Specifically, a layer containing a UV curable resin or aluminum oxide may be formed to overlap with the second electrode.

<<Display Portion 601>>

The display portion 601 includes the plurality of pixels 602 arranged in matrix (see FIG. 17C).

For example, the pixel 602 includes a sub-pixel 602B, a sub-pixel 602G, and a sub-pixel 602R, and each sub-pixel includes a display element and a pixel circuit for driving the display element.

In the pixel 602, the sub-pixel 602B is placed to overlap with the coloring layer CFB, the sub-pixel 602G is placed to overlap with the coloring layer CFG, and the sub-pixel 602R is placed to overlap with the coloring layer CFR.

In this embodiment, an example of using an organic electroluminescent element that emits white light as a display element is described; however, the display element is not limited to such element.

For example, organic electroluminescent elements that emit light of different colors may be included in sub-pixels so that the light of different colors can be emitted from the respective sub-pixels.

<<Base Material 610>>

For the base material 610, a flexible material can be used. For example, the material that can be used for the base material 66 can be used for the base material 610.

For example, a stack in which a flexible base material 610b, a barrier film 610a that prevents diffusion of impurities, and a resin layer 610c attaching the barrier film 610a to the base material 610b are stacked can be preferably used for the base material 610 (see FIG. 18).

<<Sealant 660>>

A sealant 660 bonds the base material 66 to the base material 610. The sealant 660 has a refractive index higher than that of air. In the case of extracting light to the sealant 660 side, the sealant 660 serves as an optical adhesive layer.

The pixel circuits and the light-emitting elements (e.g., a light-emitting element 650R) are provided between the base material 610 and the base material 66.

<<Pixel Structure>>

The sub-pixel 602R includes a light-emitting module 680R.

The sub-pixel 602R includes the light-emitting element 650R and the pixel circuit that can supply electric power to the light-emitting element 650R and includes a transistor 602t. Furthermore, the light-emitting module 680R includes the light-emitting element 650R and an optical element (e.g., a coloring layer CFR).

The light-emitting element 650R includes a lower electrode, an upper electrode, and a layer containing a light-emitting organic compound between the lower electrode and the upper electrode.

The light-emitting module 680R includes the coloring layer CFR on the light extraction side. The coloring layer transmits light of a particular wavelength and is, for example, a layer that selectively transmits light of red, green, or blue color. Other sub-pixels may be placed to overlap with the window portion in which the coloring layer is not provided, whereby light from the light-emitting element will be emitted not through the coloring layer.

In the case where the sealant 660 is provided on the light extraction side, the sealant 660 is in contact with the light-emitting element 650R and the coloring layer CFR.

The coloring layer CFR is positioned in a region overlapping with the light-emitting element 650R. Accordingly, part of light emitted from the light-emitting element 650R passes through the coloring layer CFR and is emitted to the outside of the light-emitting module 680R as indicated by an arrow in FIG. 18.

The light-blocking layer BM is provided to surround the coloring layer (e.g., the coloring layer CFR).

<<Configuration of Pixel Circuit>>

An insulating film 621 covering the transistor 602t included in the pixel circuit is provided. The insulating film 621 can be used as a layer for planarizing unevenness caused by the pixel circuits. A stacked film including a layer that can suppress diffusion of impurities can be used as the insulating film 621. This can suppress deterioration of the reliability of the transistor 602t or the like by diffusion of impurities.

The lower electrode is placed over the insulating film 621, and a partition wall 628 is provided over the insulating film 621 to cover an end portion of the lower electrode.

A layer containing a light-emitting organic compound is sandwiched between the lower electrode and the upper electrode, whereby a light-emitting element (e.g., the light-emitting element 650R) is formed. The pixel circuit supplies power to the light-emitting element.

In addition, a spacer that controls a gap between the base material 66 and the base material 610 is provided over the partition wall 628.

<<Structure of Scan Line Driver Circuit>>

The scan line driver circuit 603*g* includes a transistor 603*t* and a capacitor 603*c*. Note that transistors that can be formed in the same process and on the same substrate as those of the pixel circuit can be used in the driver circuit.

<<Converter CONV>>

Various circuits that can convert the sensor signal DATA supplied from the sensor unit 60U and supply the converted signal to the FPC 1 can be used as a converter CONV (see FIG. 17A and FIG. 18).

For example, a transistor M4 shown in FIG. 19A can be used in the converter CONV.

<<Structures of Other Components>>

The display portion 601 includes an anti-reflective layer 667*p* positioned in a region overlapping with the pixels. As the anti-reflective layer 667*p*, a circular polarizing plate can be used, for example.

The display portion 601 includes the wirings 611 through which signals are supplied. The wirings 611 are provided with the terminal 619. Note that the flexible substrate FPC 2 through which a signal such as an image signal or a synchronization signal are supplied is electrically connected to the terminal 619.

Note that a printed wiring board (PWB) may be attached to the flexible substrate FPC 2.

The display portion 601 includes wirings such as scan lines, signal lines, and power supply lines. Any of various conductive films can be used as the wirings.

Specifically, a metal element selected from aluminum, chromium, copper, tantalum, titanium, molybdenum, tungsten, nickel, yttrium, zirconium, silver, and manganese; an alloy including any of the above-described metal elements; an alloy including any of the above-described metal elements in combination; or the like can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which a film of a metal selected from titanium, tantalum, tungsten, molybdenum, chromium, neodymium, and scandium, an alloy film including metals selected from the above metals, or a film including a nitride of a metal selected from the above metals is stacked over an aluminum film can be used.

Alternatively, a light-transmitting conductive material including indium oxide, tin oxide, or zinc oxide may be used.

At least part of this embodiment can be implemented in combination with any of the other embodiments described in this specification as appropriate.

Embodiment 6

In this embodiment, a configuration and a driving method of the sensor circuit that can be used in the sensor unit of the input/output device of one embodiment of the present invention is described with reference to FIGS. 19A, 19B1, and 19B2.

FIGS. 19A, 19B1, and 19B2 illustrate a configuration and a driving method of the sensor circuit 69 and the converter CONV of one embodiment of the present invention.

FIG. 19A is a circuit diagram illustrating configurations of the sensor circuit 69 and the converter CONV of one embodiment of the present invention, and FIGS. 19B1 and 19B2 are timing charts illustrating driving methods.

The sensor circuit 69 of one embodiment of the present invention includes the first transistor M1 whose gate is electrically connected to the first electrode 61 of the sensor element C and whose first electrode is electrically connected to the wiring VPI that can supply, for example, a ground potential (see FIG. 19A).

Furthermore, the second transistor M2 whose gate is electrically connected to the scan line G1 that can supply a selection signal, whose first electrode is electrically connected to a second electrode of the first transistor M1, and whose second electrode is electrically connected to the signal line DL that can supply, for example, the sensor signal DATA may be included.

Furthermore, the third transistor M3 whose gate is electrically connected to the wiring RES that can supply a reset signal, whose first electrode is electrically connected to the first electrode 61 of the sensor element C, and whose second electrode is electrically connected to the wiring VRES that can supply, for example, a ground potential may be included.

The capacitance of the sensor element C is changed when an object gets closer to the first electrode 61 or the second electrode 62 or when a gap between the first electrode 61 and the second electrode 62 is changed, for example. Thus, the sensor unit 60U can supply the sensor signal DATA based on the change in the capacitance of the sensor element C.

Furthermore, the sensor unit 60U includes the wiring CS that can supply a control signal for controlling the potential of the second electrode 62 of the sensor element C.

Note that a node at which the first electrode 61 of the sensor element C, the gate of the first transistor M1, and the first electrode of the third transistor are electrically connected to each other is referred to as a node A.

The wiring VRES and the wiring VPI each can supply a ground potential, for example, and the wiring VPO and the wiring BR each can supply a high power supply potential, for example.

Furthermore, the wiring RES can supply a reset signal, the scan line G1 can supply a selection signal, and the wiring CS can supply a control signal for controlling the potential of the second electrode 62 of the sensor element C.

Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 69.

Specifically, by using the converter CONV including the transistor M4, a source follower circuit can be formed (see FIG. 19A). Note that a transistor that can be formed in the same process as those of the first transistor M1 to the third transistor M3 may be used as the transistor M4.

The transistors M1 to M3 each include a semiconductor layer. For example, for the semiconductor layer, an element belonging to group 4, a compound semiconductor, or an oxide semiconductor can be used. Specifically, a semiconductor containing silicon, a semiconductor containing gallium arsenide, an oxide semiconductor containing indium, or the like can be used.

A structure of a transistor in which an oxide semiconductor is used for a semiconductor layer is described in detail in Embodiment 5.

<Driving Method of Sensor Circuit 69>

A driving method of the sensor circuit 69 is described.

<<First Step>>

In a first step, a reset signal that turns on and then turns off the third transistor is supplied to the gate, and the potential of the first electrode 61 of the sensor element C is set to a predetermined potential (see a period T1 in FIG. 19B1).

Specifically, the reset signal is supplied from the wiring RES. The third transistor to which the reset signal is supplied sets the potential of the node A to a ground potential, for example (see FIG. 19A).

<<Second Step>>

In a second step, a selection signal that turns on the second transistor M2 is supplied to the gate of the second transistor M2, and the second electrode of the first transistor is electrically connected to the signal line DL.

Specifically, the selection signal is supplied from the scan line G1. Through the second transistor M2 to which the selection signal is supplied, the second electrode of the first transistor is electrically connected to the signal line DL (see a period T2 in FIG. 19B1).

<<Third Step>>

In a third step, a control signal is supplied to the second electrode of the sensor element C, and a potential changed based on the control signal and the capacitance of the sensor element C is supplied to the gate of the first transistor M1.

Specifically, a rectangular wave control signal is supplied from the wiring CS. By supplying the rectangular wave control signal to the second electrode 62 of the sensor element C, the potential of the node A is increased based on the capacitance of the sensor element C (see the latter half in the period T2 in FIG. 19B1).

For example, in the case where the sensor element is put in the air, when an object whose dielectric constant is higher than that of the air is placed closer to the second electrode 62 of the sensor element C, the capacitance of the sensor element C is apparently increased.

Thus, the change in the potential of the node A due to the rectangular wave control signal becomes smaller than that in the case where an object whose dielectric constant is higher than that of the air is placed is not placed closer (see a solid line in FIG. 19B2).

<<Fourth Step>>

In a fourth step, a signal obtained by the change in the potential of the gate of the first transistor M1 is supplied to the signal line DL.

For example, a change in current due to the change in the potential of the gate of the first transistor M1 is supplied to the signal line DL.

The converter CONV converts the change in the current flowing through the signal line DL into a change in voltage and outputs the voltage.

<<Fifth Step>>

In a fifth step, a selection signal for turning off the second transistor M2 is supplied to the gate of the second transistor M2.

At least part of this embodiment can be implemented in combination with any of the embodiments described in this specification as appropriate.

Embodiment 7

In this embodiment, examples of an electronic device and a lighting device that include the display device of one embodiment of the present invention are described below with reference to drawings.

As examples of electronic devices including a display device with flexibility, the following can be given: television devices (also called televisions or television receivers), monitors of computers or the like, digital cameras, digital video cameras, digital photo frames, mobile phones (also called cellular phones or mobile phone devices), portable game machines, mobile phones, audio reproducing devices, and large game machines such as pachinko machines.

In addition, a lighting device or a display device can be incorporated along a curved inside/outside wall surface of a house or a building or a curved interior/exterior surface of a car.

Figure 20A:
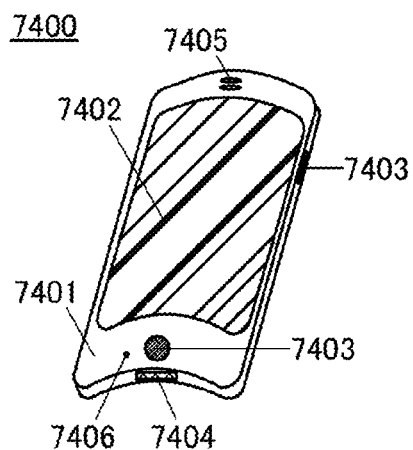
FIGS. 20A to 20D illustrate examples of electronic devices and lighting devices.

FIG. 20A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the display device in the display portion 7402.

When the display portion 7402 of the mobile phone 7400 illustrated in FIG. 20A is touched with a finger or the like, data can be input to the mobile phone 7400. In addition, operations such as making a call and inputting text can be performed by touch on the display portion 7402 with a finger or the like.

The power can be turned on or off with the operation button 7403. In addition, types of images displayed on the display portion 7402 can be switched: for example, switching images from a mail creation screen to a main menu screen is performed with the operation button 7403.

Here, the display portion 7402 includes the display device of one embodiment of the present invention. Thus, the mobile phone can have a curved display portion and high reliability.

Figure 20B:
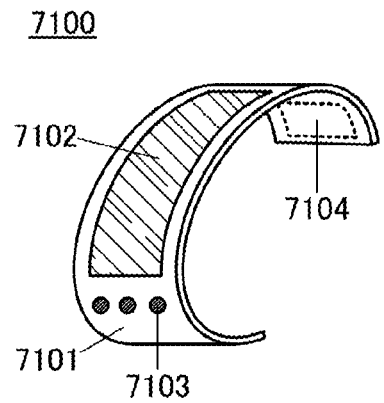

FIG. 20B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the mobile display device can have a curved display portion and high reliability.

Figure 20C:
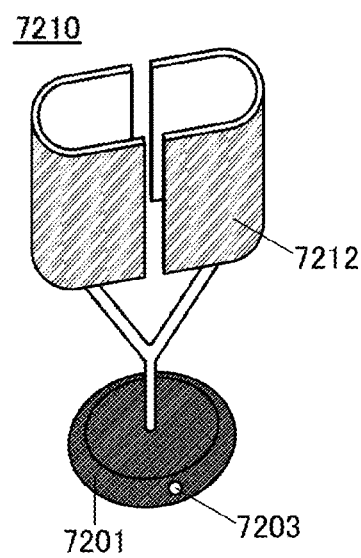
Figure 20D:
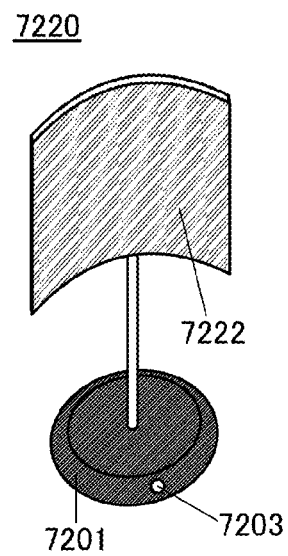

FIGS. 20C and 20D illustrate examples of lighting devices. Lighting devices 7210 and 7220 each include a stage 7201 provided with an operation switch 7203 and a light-emitting portion supported by the stage 7201.

A light-emitting portion 7212 included in the lighting device 7210 illustrated in FIG. 20C has two convex-curved light-emitting portions symmetrically placed. Thus, light radiates from the lighting device 7210.

The lighting device 7220 illustrated in FIG. 20D includes a concave-curved light-emitting portion 7222. This is suitable for illuminating a specific range because light emitted from the light-emitting portion 7222 is collected to the front of the lighting device 7220.

The light-emitting portion included in each of the lighting devices 7210 and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7210 and 7220 each include the display device of one embodiment of the present invention. Thus, the lighting devices can have curved display portions and high reliability.

Figure 21A:
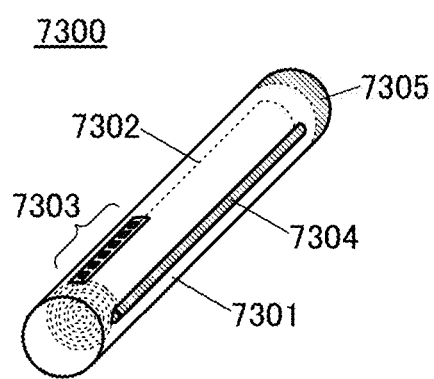
FIGS. 21A and 21B illustrate an example of an electronic device.

FIG. 21A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 21B:
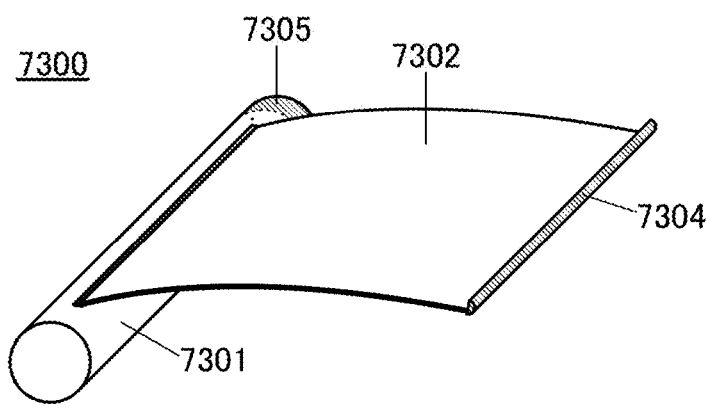

FIG. 21B illustrates a state in which the display portion 7302 is pulled out with the display portion pull 7304. Videos can be displayed on the display portion 7302 in this state. In addition, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a flexible, highly reliable display device, which makes the display device 7300 lightweight and highly reliable.

It is needless to say that the embodiment of the present invention is not limited to the above-described electronic devices and lighting devices as long as the display device of one embodiment of the present invention is included.

The structures, methods, and the like described in this embodiment can be used in appropriate combination with any of the structures, methods, and the like described in the other embodiments.

This application is based on Japanese Patent Application serial no. 2014-023930 filed with Japan Patent Office on Feb. 11, 2014, and Japanese Patent Application serial no. 2014-045128 filed with Japan Patent Office on Mar. 7, 2014, the entire contents of which are hereby incorporated by reference.

EXPLANATION OF REFERENCE

10: display device, 11: display region, 15: column, 16: wall, 21: interior member, 22: exterior member, 23: supporting member, 25: antenna, 26: light-blocking portion, 27: wireless signal, 50: electronic device, 51*a*: support, 51*b*: support, 51*c*: support, 52: hinge, 52*a*: hinge, 52*b*: hinge, 53*a*: substrate, 53*b*: substrate, 53*c*: substrate, 54*a*: terminal, 54*b*: terminal, 54*c*: terminal, 55*a*: battery, 55*b*: battery, 55*c*: battery, 60U: sensor unit, 61: electrode, 62: electrode, 63: insulating layer, 64: window portion, 66: base material, 66*a*: barrier film, 66*b*: base material, 66*c*: resin layer, 67: protective base material, 67*p*: protective layer, 69: sensor circuit, 70: electronic device, 100: display panel, 100*a*: display panel, 100*b*: display panel, 100*c*: display panel, 100*d*: display panel, 100*e*: display panel, 100*f*: display panel, 100*g*: display panel, 100*h*: display panel, 100*i*: display panel, 100*j*: display panel, 101: display region, 101*a*: display region, 101*b*: display region, 101*c*: display region, 101*d*: display region, 110: region, 110*a*: region, 110*b*: region, 110*c*: region, 110*d*: region, 112: FPC, 112*a*: FPC, 112*b*: FPC, 112*c*: FPC, 120: region, 120*b*: region, 120*c*: region, 123: FPC, 131: resin layer, 132: protective substrate, 133: resin layer, 134: protective substrate, 141: pixel, 141*a*: pixel, 141*b*: pixel, 142*a*: wiring, 142*b*: wiring, 143*a*: circuit, 143*b*: circuit, 145: wiring, 150: wireless module, 151: substrate, 152: substrate, 153: bonding layer, 300: touch panel, 301: display portion, 302: pixel, 302B: sub-pixel, 302G: sub-pixel, 302R: sub-pixel, 302*t*: transistor, 303*c*: capacitor, 303*g*(1): scan line driver circuit, 303*g*(2): imaging pixel driver circuit, 303*s*(1): image signal line driver circuit, 303*s*(2): imaging signal line driver circuit, 303*t*: transistor, 308: imaging pixel, 308*p*: photoelectric conversion element, 308*t*: transistor, 309: FPC, 310: substrate, 310*a*: barrier film, 310*b*: substrate, 310*c*: bonding layer, 311: wiring, 319: terminal, 321: insulating film, 328: partition wall, 329: spacer, 350R: first light-emitting element, 351R: lower electrode, 352: upper electrode, 353: layer, 353*a*: light-emitting unit, 353*b*: light-emitting unit, 354: intermediate layer, 360: sealant, 367BM: light-blocking layer, 367*p*: anti-reflective layer, 367R: first coloring layer, 370: counter substrate, 370*a*: barrier film, 370*b*: substrate, 370*c*: bonding layer, 380B: light-emitting module, 380G: light-emitting module, 380R: light-emitting module, 500: touch panel, 500B: touch panel, 501: display portion, 502R: sub-pixel, 502*t*: transistor, 503*c*: capacitor, 503*g*: scan line driver circuit, 503*t*: transistor, 509: FPC, 510: substrate, 510*a*: barrier film, 510*b*: substrate, 510*c*: bonding layer, 511: wiring, 519: terminal, 521: insulating film, 528: partition wall, 550R: first light-emitting element, 560: sealant, 567BM: light-blocking layer, 567*p*: anti-reflective layer, 567R: first coloring layer, 570: substrate, 570*a*: barrier film, 570*b*: substrate, 570*c*: bonding layer, 580R: light-emitting module, 590: substrate, 591: electrode, 592: electrode, 593: insulating layer, 594: wiring, 595: touch sensor, 597: bonding layer, 598: wiring, 599: connection layer, 600: input/output device, 601: display portion, 602: pixel, 602B: sub-pixel, 602G: sub-pixel, 602R: sub-pixel, 602*t*: transistor, 603*c*: capacitor, 603*g*: scan line driver circuit, 603*t*: transistor, 610: base material, 610*a*: barrier film, 610*b*: base material, 610*c*: resin layer, 611: wiring, 619: terminal, 620: input device, 621: insulating film, 628: partition wall, 650R: light-emitting element, 660: sealant, 667*p*: anti-reflective layer, 680R: light-emitting module, 7100: portable display device, 7101: housing, 7102: display portion, 7103: operation button, 7104: sending and receiving device, 7201: stage, 7203: operation switch, 7210: lighting device, 7212: light-emitting portion, 7220: lighting device, 7222: light-emitting portion, 7300: display device, 7301: housing, 7302: display portion, 7303: operation button, 7304: display portion pull, 7305: control portion, 7400:

mobile phone, 7401: housing, 7402: display portion, 7403: operation button, 7404: external connection port, 7405: speaker, 7406: microphone.

The invention claimed is:

1. A display device comprising:
a first display panel;
a second display panel overlapping the first display panel;
a first FPC electrically connected to the first display panel; and
a second FPC electrically connected to the second display panel,
wherein the first display panel and the second display panel each include a pair of substrates,
wherein the first display panel and the second display panel each include a first region, a second region, and a third region,
wherein the first region can transmit visible light,
wherein the second region can block visible light,
wherein the third region can perform display,
wherein the third region of the first display panel and the first region of the second display panel overlap each other,
wherein the third region of the first display panel and the second region of the second display panel do not overlap each other, and
wherein the first display panel includes a curved portion connected to the first FPC such that the first FPC is between the first display panel and the second display panel.

2. The display device according to claim 1,
wherein the first display panel and the second display panel each include a light-emitting element in the third region, a wiring in the second region along part of an outer edge of the third region, and a sealant in the first region along another part of the outer edge of the third region, and
wherein the first region includes a region with a width of 1 mm or more and 100 mm or less.

3. The display device according to claim 1, wherein the pair of substrates each have flexibility.

4. The display device according to claim 1, further comprising a layer,
wherein the layer includes a resin material,
wherein the layer and the third region of the first display panel overlap each other,
wherein the layer and the third region of the second display panel overlap each other,
wherein the layer has a first refractive index,
wherein a substrate on a display surface side of the pair of substrates has a second refractive index, and
wherein a difference between the first refractive index and the second refractive index is lower than or equal to 10%.

5. A display module comprising the display device according to claim 1, further comprising a touch sensor.

6. A display module comprising the display device according to claim 1, further comprising a first wireless module electrically connected to the first display panel and a second wireless module electrically connected to the second display panel,
wherein the first wireless module is capable of extracting a first signal from a received wireless signal and supplying the first signal to the first display panel, and
wherein the second wireless module is capable of extracting a second signal from the received wireless signal and supplying the second signal to the second display panel.

7. A building comprising the display device according to claim 1, wherein the display device is on a column or a wall.

8. The display device according to claim 1, wherein the first display panel and the second display panel each include a transistor.

9. The display device according to claim 8, wherein a channel of the transistor includes an oxide semiconductor.

10. The display device according to claim 1, further comprising a touch sensor continuously overlapping the first display panel and the second display panel.

11. The display device according to claim 1,
wherein input of image data to the first display panel is configured to be stopped in a region where the third region of the first display panel and the third region of the second display panel overlap each other.

12. A display device comprising:
a first display panel;
a second display panel overlapping the first display panel;
a third display panel overlapping the first display panel;
a first FPC electrically connected to the first display panel;
a second FPC electrically connected to the second display panel; and
a third FPC electrically connected to the third display panel,
wherein the first display panel, the second display panel, and the third display panel each include a pair of substrates,
wherein the first display panel, the second display panel, and the third display panel each include a first region, a second region, and a third region,
wherein the first region can transmit visible light,
wherein the second region can block visible light,
wherein the third region can perform display,
wherein the first display panel, the second display panel, and the third display panel each include a light-emitting element in the third region,
wherein the first display panel, the second display panel, and the third display panel each include a wiring in the second region along part of an outer edge of the third region,
wherein the first display panel, the second display panel, and the third display panel each include a sealant in the first region along another part of the outer edge of the third region,
wherein the first region includes a region with a width of 1 mm or more and 100 mm or less,
wherein the third region of the first display panel and the first region of the second display panel overlap each other,
wherein the third region of the first display panel and the second region of the second display panel do not overlap each other,
wherein the third region of the first display panel and the first region of the third display panel overlap each other,
wherein the third region of the first display panel and the second region of the third display panel do not overlap each other,
wherein the third region of the second display panel and the second region of the third display panel do not overlap each other, and
wherein the first display panel includes a curved portion connected to the first FPC such that the first FPC is between the first display panel and the second display panel.

13. The display device according to claim 12, wherein the pair of substrates each have flexibility.

14. The display device according to claim 12, further comprising a layer,
   wherein the layer includes a resin material,
   wherein the layer and the third region of the first display panel overlap each other,
   wherein the layer and the third region of the second display panel overlap each other,
   wherein the layer has a first refractive index,
   wherein a substrate on a display surface side of the pair of substrates has a second refractive index, and
   wherein a difference between the first refractive index and the second refractive index is lower than or equal to 10%.

15. A display module comprising the display device according to claim 12, further comprising a touch sensor.

16. A display module comprising the display device according to claim 12, further comprising a first wireless module electrically connected to the first display panel, a second wireless module electrically connected to the second display panel, and a third wireless module electrically connected to the third display panel,
   wherein the first wireless module is capable of extracting a first signal from a received wireless signal and supplying the first signal to the first display panel,
   wherein the second wireless module is capable of extracting a second signal from the received wireless signal and supplying the second signal to the second display panel, and
   wherein the third wireless module is capable of extracting a third signal from the received wireless signal and supplying the third signal to the third display panel.

17. A building comprising the display device according to claim 12, wherein the display device is on a column or a wall.

18. An electronic device comprising:
   a first display panel;
   a second display panel overlapping the first display panel;
   a third display panel overlapping the second display panel;
   a first support; and
   a second support,
   wherein the second display panel has flexibility,
   wherein the first display panel, the second display panel, and the third display panel each include a first region, a second region, and a third region,
   wherein the first region is capable of transmitting visible light,
   wherein the second region is capable of blocking visible light,
   wherein the third region is capable of performing display,
   wherein the third region of the first display panel and the first region of the second display panel overlap each other,
   wherein the third region of the second display panel and the first region of the third display panel overlap each other,
   wherein the first display panel is supported by the first support,
   wherein the third display panel is supported by the second support,
   wherein the first support and the second support are capable of being opened in an opened state or closed in a folded state,
   wherein in the opened state, the first display panel, the second display panel, and the third display panel are positioned on substantially the same plane, and
   wherein in the folded state, the first display panel and the third display panel overlap each other, the third region of the second display panel includes a folded region, and the first portion and the second portion do not include a folded region.

19. The electronic device according to claim 18,
   wherein the first display panel includes a first FPC,
   wherein the first FPC and the second region of the first display panel overlap each other,
   wherein the first FPC and the third region of the second display panel overlap each other, and
   wherein the first FPC is on a side opposite to a display surface side of the second display panel.

20. The electronic device according to claim 18,
   wherein the second display panel includes a second FPC,
   wherein the second FPC and the second region of the second display panel overlap each other,
   wherein the second FPC and the third region of the third display panel overlap each other, and
   wherein the second FPC is on a side opposite to a display surface side of the third display panel.

21. The electronic device according to claim 18, wherein the first display panel, the second display panel, and the third display panel each include a touch sensor.

22. The electronic device according to claim 21, wherein the touch sensor includes a transistor and a capacitor.

23. The electronic device according to claim 22, wherein a channel of the transistor includes an oxide semiconductor.

* * * * *